US012294023B2

(12) United States Patent
Chen et al.

(10) Patent No.: US 12,294,023 B2
(45) Date of Patent: May 6, 2025

(54) METHOD OF MANUFACTURING A SEMICONDUCTOR DEVICE HAVING CORNER SPACERS ADJACENT A FIN SIDEWALL

(71) Applicant: Taiwan Semiconductor Manufacturing Co., Ltd., Hsinchu (TW)

(72) Inventors: Chen-Ping Chen, Toucheng Township (TW); Kuei-Yu Kao, Hsinchu (TW); Shih-Yao Lin, New Taipei (TW); Chih-Han Lin, Hsinchu (TW); Ming-Ching Chang, Hsinchu (TW); Chao-Cheng Chen, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 73 days.

(21) Appl. No.: 17/818,647

(22) Filed: Aug. 9, 2022

(65) Prior Publication Data

US 2022/0384617 A1    Dec. 1, 2022

Related U.S. Application Data

(62) Division of application No. 17/101,291, filed on Nov. 23, 2020, now Pat. No. 11,769,821.

(Continued)

(51) Int. Cl.
*H01L 29/66*     (2006.01)
*H01L 21/8234*   (2006.01)
(Continued)

(52) U.S. Cl.
CPC .......... *H01L 29/66795* (2013.01); *H01L 21/823431* (2013.01); *H01L 21/823468* (2013.01);
(Continued)

(58) Field of Classification Search
CPC ..... H01L 21/823431; H01L 21/823821; H01L 21/845; H01L 27/0886; H01L 27/0924;
(Continued)

(56) References Cited

U.S. PATENT DOCUMENTS 7,667,271 B2    2/2010  Yu et al.
7,910,453 B2    3/2011  Xu et al.
(Continued)

FOREIGN PATENT DOCUMENTS

CN    110349852 A    10/2019
CN    111128740 A     5/2020
(Continued)

*Primary Examiner* — Younes Boulghassoul
(74) *Attorney, Agent, or Firm* — Slater Matsil, LLP

(57) ABSTRACT

A device includes a fin protruding from a semiconductor substrate; a gate stack over and along a sidewall of the fin; a gate spacer along a sidewall of the gate stack and along the sidewall of the fin; an epitaxial source/drain region in the fin and adjacent the gate spacer; and a corner spacer between the gate stack and the gate spacer, wherein the corner spacer extends along the sidewall of the fin, wherein a first region between the gate stack and the sidewall of the fin is free of the corner spacer, wherein a second region between the gate stack and the gate spacer is free of the corner spacer.

20 Claims, 38 Drawing Sheets

Related U.S. Application Data

(60) Provisional application No. 63/025,332, filed on May 15, 2020.

(51) Int. Cl.
  *H01L 21/8238* (2006.01)
  *H01L 29/78* (2006.01)

(52) U.S. Cl.
  CPC .............. *H01L 21/823821* (2013.01); *H01L 21/823864* (2013.01); *H01L 29/66545* (2013.01); *H01L 29/6656* (2013.01); *H01L 29/7851* (2013.01); *H01L 2029/7858* (2013.01)

(58) Field of Classification Search
  CPC ........... H01L 27/1211; H01L 29/41791; H01L 29/66795–66818; H01L 29/785–7856; H01L 2029/7857–7858; H01L 2924/13067; H01L 29/78696; H01L 29/42392; H01L 29/0673; H01L 29/66439; H01L 29/775; H01L 21/823468; H01L 21/823864; H01L 29/6656; H01L 29/6653; H01L 29/66553; H01L 29/0653; H01L 29/66545; H01L 21/66553; H01L 21/0653; H10B 12/36; H10B 12/056
  See application file for complete search history.

(56) References Cited

U.S. PATENT DOCUMENTS

| | | | |
|---|---|---|---|
| 8,264,048 B2* | 9/2012 | Rachmady | H01L 21/28114 257/365 |
| 8,377,779 B1 | 2/2013 | Wang | |
| 8,399,931 B2 | 3/2013 | Liaw et al. | |
| 8,652,894 B2 | 2/2014 | Lin et al. | |
| 8,686,516 B2 | 4/2014 | Chen et al. | |
| 8,716,765 B2 | 5/2014 | Wu et al. | |
| 8,723,272 B2 | 5/2014 | Liu et al. | |
| 8,729,627 B2 | 5/2014 | Cheng et al. | |
| 8,735,993 B2 | 5/2014 | Lo et al. | |
| 8,736,056 B2 | 5/2014 | Lee et al. | |
| 8,772,109 B2 | 7/2014 | Colinge | |
| 8,785,285 B2 | 7/2014 | Tsai et al. | |
| 8,816,444 B2 | 8/2014 | Wann et al. | |
| 8,860,148 B2 | 10/2014 | Hu et al. | |
| 9,105,490 B2 | 8/2015 | Wang et al. | |
| 10,797,157 B1 | 10/2020 | Chuang et al. | |
| 2007/0267678 A1 | 11/2007 | Lo | |
| 2009/0206406 A1 | 8/2009 | Rachmady et al. | |
| 2014/0001574 A1 | 1/2014 | Chen et al. | |
| 2014/0110755 A1 | 4/2014 | Colinge | |
| 2014/0151812 A1 | 6/2014 | Liaw | |
| 2014/0239393 A1* | 8/2014 | Kuo | H01L 29/6653 438/424 |
| 2015/0084102 A1* | 3/2015 | Park | H01L 29/6653 257/288 |
| 2015/0236123 A1 | 8/2015 | Chang et al. | |
| 2015/0364593 A1 | 12/2015 | Jangjian et al. | |
| 2016/0111543 A1* | 4/2016 | Fang | H01L 29/66795 257/401 |
| 2016/0307927 A1 | 10/2016 | Lee et al. | |
| 2016/0365414 A1 | 12/2016 | Peng et al. | |
| 2017/0062617 A1 | 3/2017 | Fang et al. | |
| 2017/0084714 A1 | 3/2017 | Ching et al. | |
| 2019/0305105 A1* | 10/2019 | Gao | H01L 29/785 |
| 2020/0020776 A1* | 1/2020 | Yang | H01L 29/66636 |
| 2020/0105910 A1 | 4/2020 | Yeong et al. | |
| 2020/0135474 A1 | 4/2020 | Chen et al. | |
| 2020/0135880 A1 | 4/2020 | Chen et al. | |
| 2021/0057545 A1* | 2/2021 | Lin | H01L 29/0653 |
| 2021/0183713 A1* | 6/2021 | Syu | H01L 29/4236 |

FOREIGN PATENT DOCUMENTS

| | | |
|---|---|---|
| KR | 20150143259 A | 12/2015 |
| KR | 20160122475 A | 10/2016 |
| KR | 20200050336 A | 5/2020 |
| TW | 201434109 A | 9/2014 |

* cited by examiner

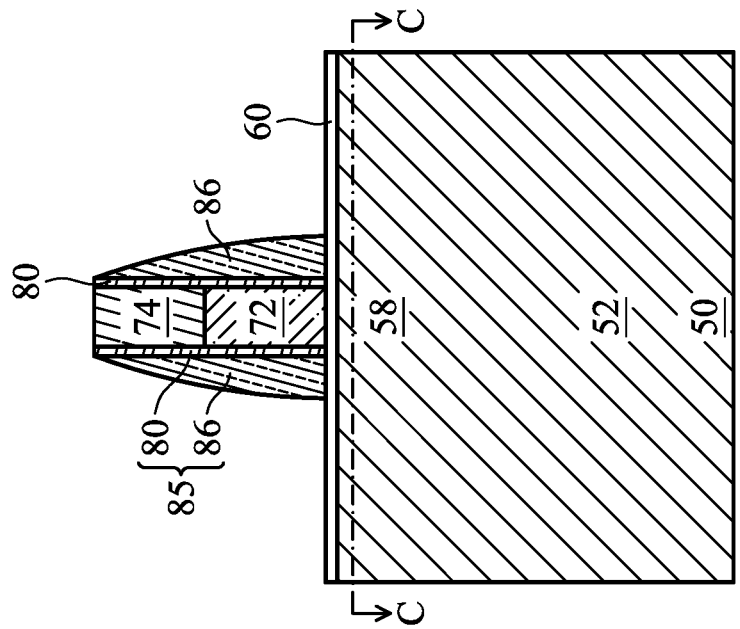
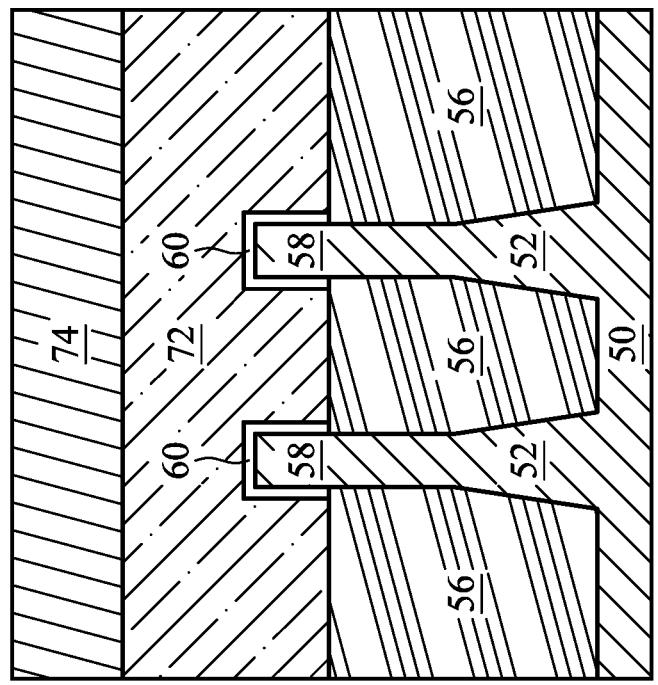
FIG. 9B
FIG. 9A

METHOD OF MANUFACTURING A SEMICONDUCTOR DEVICE HAVING CORNER SPACERS ADJACENT A FIN SIDEWALL

PRIORITY CLAIM AND CROSS-REFERENCE

This application is a divisional of U.S. patent application Ser. No. 17/101,291, entitled "Semiconductor Device and Method," filed on Nov. 23, 2020, which claims the benefit of U.S. Provisional Application No. 63/025,332, filed on May 15, 2020, which applications are hereby incorporated herein by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 8A, 8B, 8C, 9A, 9B, 9C, 10A, 10B, 10C, 10D, 10E, 11A, 11B, 12A, 12B, 13A, 13B, and 13C are various views of intermediate stages in the manufacturing of FinFETs, in accordance with some embodiments.

DETAILED DESCRIPTION

Figure 1:
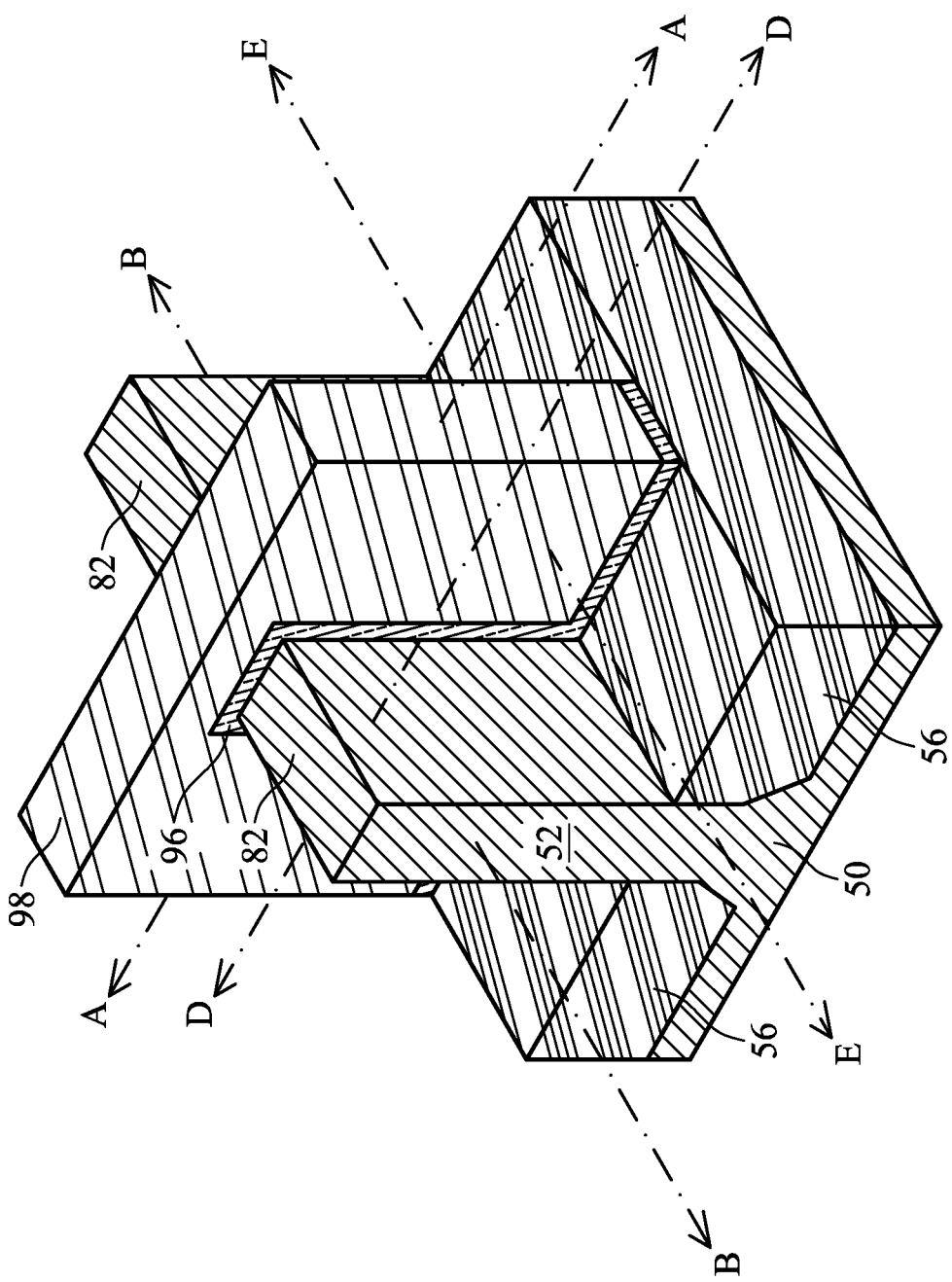
FIG. 1 illustrates an example of a FinFET in a three-dimensional view, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Various embodiments describe processes for forming spacers that separate the corners of a replacement gate stack of a FinFET device from adjacent epitaxial source/drain regions. In some embodiments, after removing the dummy gate stack, a dielectric layer is deposited in the recess formed where the dummy gate stack was present. The dielectric layer is then etched such that portions of the dielectric layer are left remaining in corner regions of the recess. These remaining portions of the dielectric layer form "corner spacers" that block the replacement gate stack from being formed in the corner regions of the recess. The corner spacers are between the replacement gate stack and the epitaxial source/drain regions and thus increase the separation distance between the replacement gate stack and the epitaxial source/drain regions. This increased separation distance between the replacement gate stack and the epitaxial source/drain regions can reduce parasitic capacitance and/or leakage current between the replacement gate stack and the epitaxial source/drain regions, and thus can improve the speed, performance, reliability, and/or yield of a FinFET device.

FIG. 1 illustrates an example of a FinFET in a three-dimensional view, in accordance with some embodiments. The FinFET comprises a fin 52 on a substrate 50 (e.g., a semiconductor substrate). Isolation regions 56 are disposed in the substrate 50, and the fin 52 protrudes above and from between neighboring isolation regions 56. Although the isolation regions 56 are described/illustrated as being separate from the substrate 50, as used herein the term "substrate" may be used to refer to just the semiconductor substrate or a semiconductor substrate inclusive of isolation regions. Additionally, although the fin 52 is illustrated as a single, continuous material as the substrate 50, the fin 52 and/or the substrate 50 may comprise a single material or a plurality of materials. In this context, the fin 52 refers to the portion extending between the neighboring isolation regions 56.

A gate dielectric layer 96 is along sidewalls and over a top surface of the fin 52, and a gate electrode 98 is over the gate dielectric layer 96. Source/drain regions 82 are disposed in opposite sides of the fin 52 with respect to the gate dielectric layer 96 and gate electrode 98. FIG. 1 further illustrates reference cross-sections that are used in later figures. Cross-section A-A is along a longitudinal axis of the gate electrode 98 and in a direction, for example, perpendicular to the direction of current flow between the source/drain regions 82 of the FinFET. Cross-section B-B is perpendicular to cross-section A-A and is along a longitudinal axis of the fin 52 and in a direction of, for example, a current flow between the source/drain regions 82 of the FinFET. Cross-section D-D is parallel to cross-section A-A and extends through a source/drain region 82 of the FinFET. Cross-section E-E is parallel to cross-section B-B and extends through the gate electrode 98 of the FinFET. Subsequent figures refer to these reference cross-sections for clarity.

Some embodiments discussed herein are discussed in the context of FinFETs formed using a gate-last process. In other embodiments, a gate-first process may be used. Also, some embodiments contemplate aspects used in planar devices, such as planar FETs, nanostructure (e.g., nanosheet, nanowire, gate-all-around, or the like) field effect transistors (NSFETs), or the like.

FIGS. 2 through 20B are cross-sectional views of intermediate stages in the manufacturing of FinFETs, in accordance with some embodiments. FIGS. 2 through 7 illustrate reference cross-section A-A illustrated in FIG. 1, except for multiple fins/FinFETs. FIGS. 8A, 9A, 10A, 11A, 12A, 13A, 14A, 16A, 18A, 19A, and 20A are illustrated along reference cross-section A-A illustrated in FIG. 1, and FIGS. 8B, 9B, 10B, 11B, 12B, 13B, 14B, 16B, 18B, 18D, 19B, and 20B are illustrated along a similar cross-section B-B illustrated in FIG. 1, except for multiple fins/FinFETs. FIGS. 8C, 9C, 10C, 13C, 14C, 16C, 17A, 17B, 17C, 17D, and 18C are illustrated as plan views at the cross-section C-C illustrated in FIGS. 8A and 8B. The cross-section C-C is a cross-section through the channel region 58 and the epitaxial source/drain regions 82 (see FIGS. 10A-E) of a fin 52, and is parallel to a major surface of the substrate 50. FIGS. 10D and 10E are illustrated along reference cross-section D-D illustrated in FIG. 1, except for multiple fins/FinFETs. FIGS. 15A, 15B, and 15C are illustrated along reference cross-section E-E illustrated in FIG. 1 and FIG. 14C.

Figure 2:
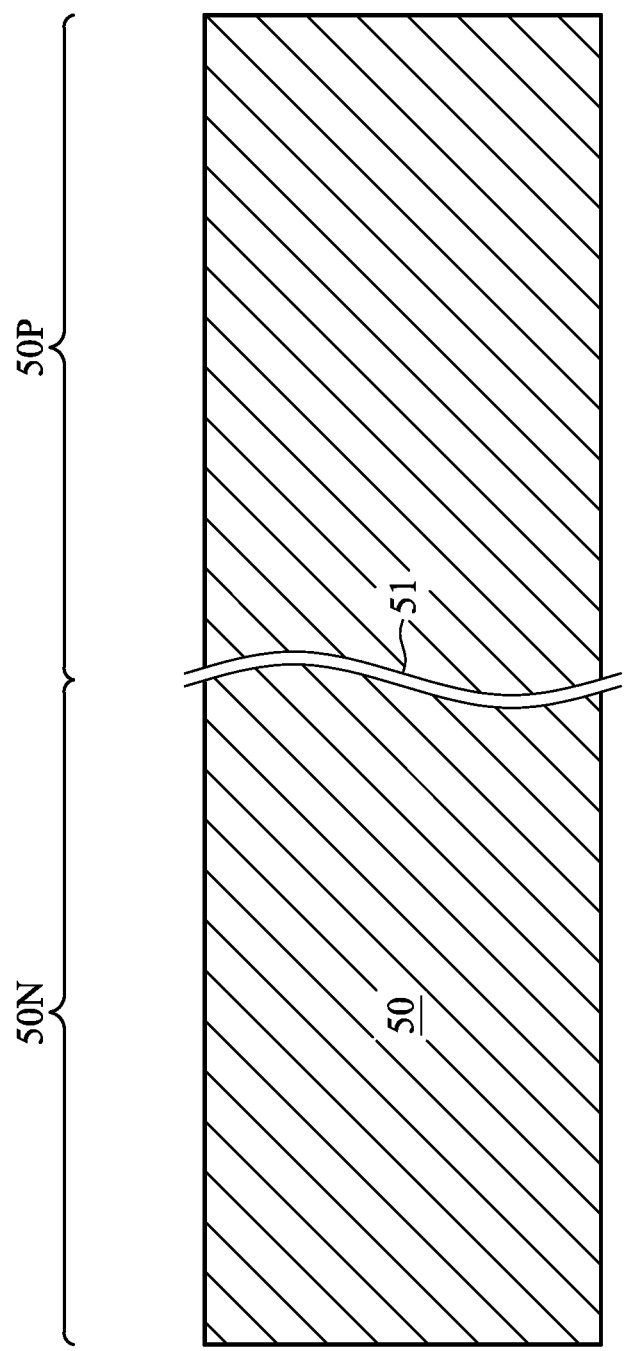
FIGS. 2, 3, 4, 5, 6, and 7 are cross-sectional views of intermediate stages in the manufacturing of FinFETs, in accordance with some embodiments.

In FIG. 2, a substrate 50 is provided. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof.

The substrate 50 has an n-type region 50N and a p-type region 50P. The n-type region 50N can be for forming n-type devices, such as NMOS transistors, e.g., n-type FinFETs. The p-type region 50P can be for forming p-type devices, such as PMOS transistors, e.g., p-type FinFETs. The n-type region 50N may be physically separated from the p-type region 50P (as illustrated by divider 51), and any number of device features (e.g., other active devices, doped regions, isolation structures, etc.) may be disposed between the n-type region 50N and the p-type region 50P.

Figure 3:
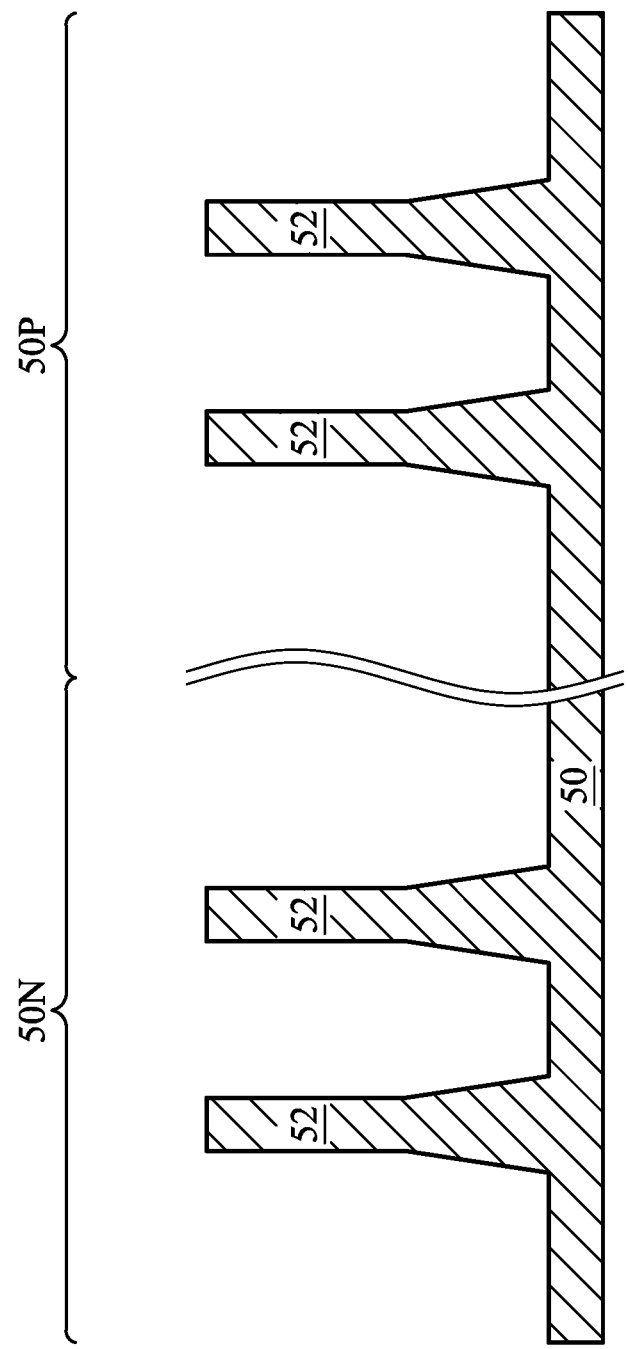

In FIG. 3, fins 52 are formed in the substrate 50. The fins 52 are semiconductor strips. In some embodiments, the fins 52 may be formed in the substrate 50 by etching trenches in the substrate 50. The etching may be any acceptable etch process, such as a reactive ion etch (RIE), neutral beam etch (NBE), the like, or a combination thereof. The etch may be anisotropic.

The fins may be patterned by any suitable method. For example, the fins 52 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins. In some embodiments, the mask (or other layer) may remain on the fins 52.

Figure 4:
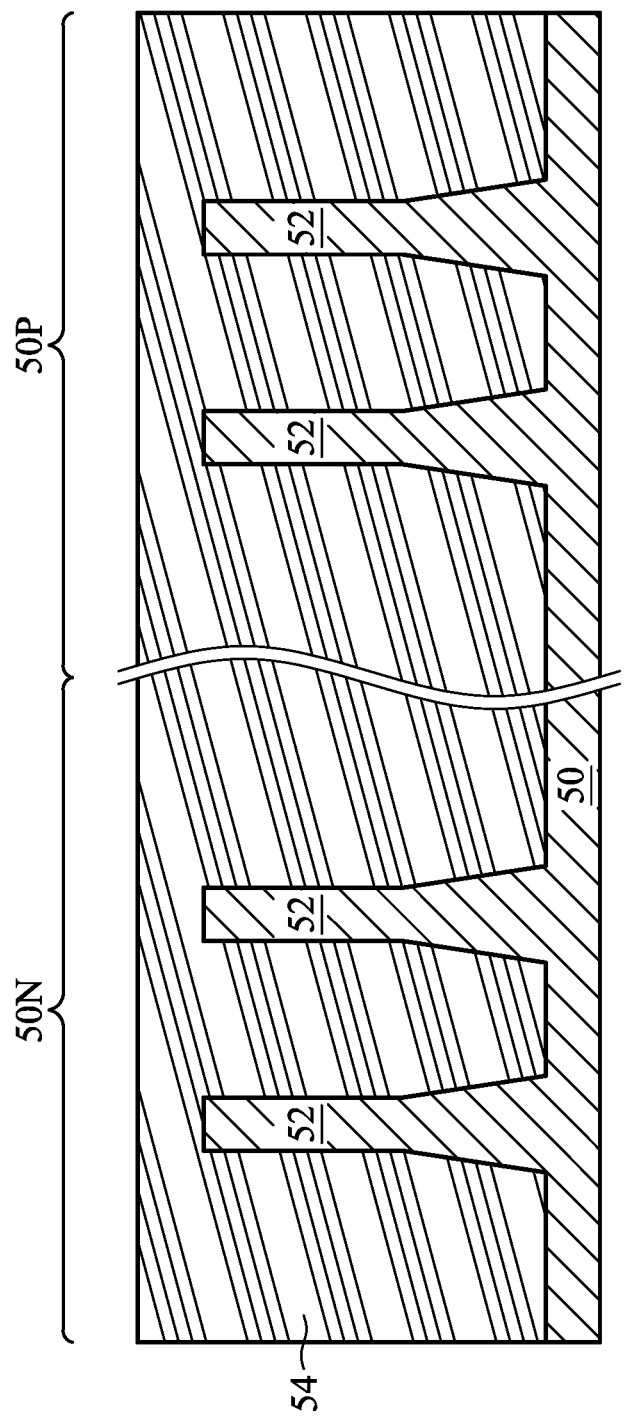

In FIG. 4, an insulation material 54 is formed over the substrate 50 and between neighboring fins 52. The insulation material 54 may be an oxide, such as silicon oxide, a nitride, the like, or a combination thereof, and may be formed by a high density plasma chemical vapor deposition (HDP-CVD), a flowable CVD (FCVD) (e.g., a CVD-based material deposition in a remote plasma system and post curing to make it convert to another material, such as an oxide), the like, or a combination thereof. Other insulation materials formed by any acceptable process may be used. In the illustrated embodiment, the insulation material 54 is silicon oxide formed by a FCVD process. An anneal process may be performed once the insulation material is formed. In an embodiment, the insulation material 54 is formed such that excess insulation material 54 covers the fins 52. Although the insulation material 54 is illustrated as a single layer, some embodiments may utilize multiple layers. For example, in some embodiments a liner (not shown) may first be formed along a surface of the substrate 50 and the fins 52. Thereafter, a fill material, such as those discussed above may be formed over the liner.

Figure 5:
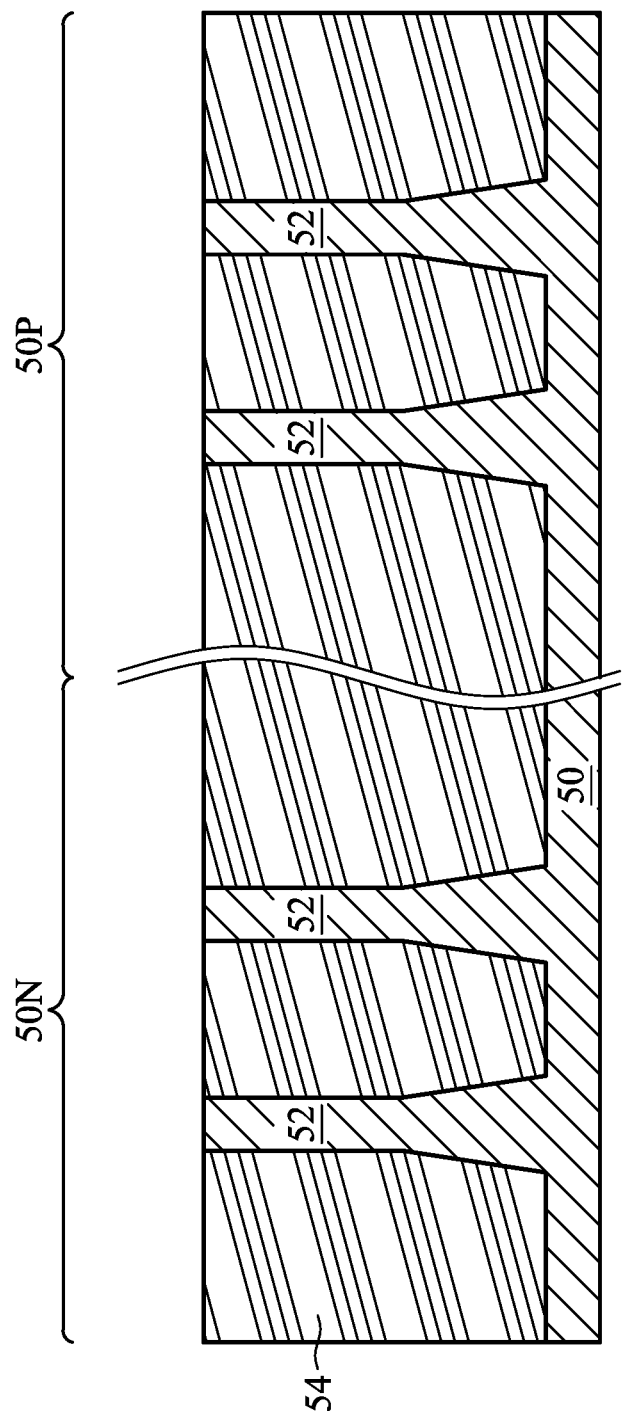

In FIG. 5, a removal process is applied to the insulation material 54 to remove excess insulation material 54 over the fins 52. In some embodiments, a planarization process such as a chemical mechanical polish (CMP), an etch-back process, combinations thereof, or the like may be utilized. The planarization process exposes the fins 52 such that top surfaces of the fins 52 and the insulation material 54 are level after the planarization process is complete. In embodiments in which a mask remains on the fins 52, the planarization process may expose the mask or remove the mask such that top surfaces of the mask or the fins 52, respectively, and the insulation material 54 are level after the planarization process is complete.

Figure 6:
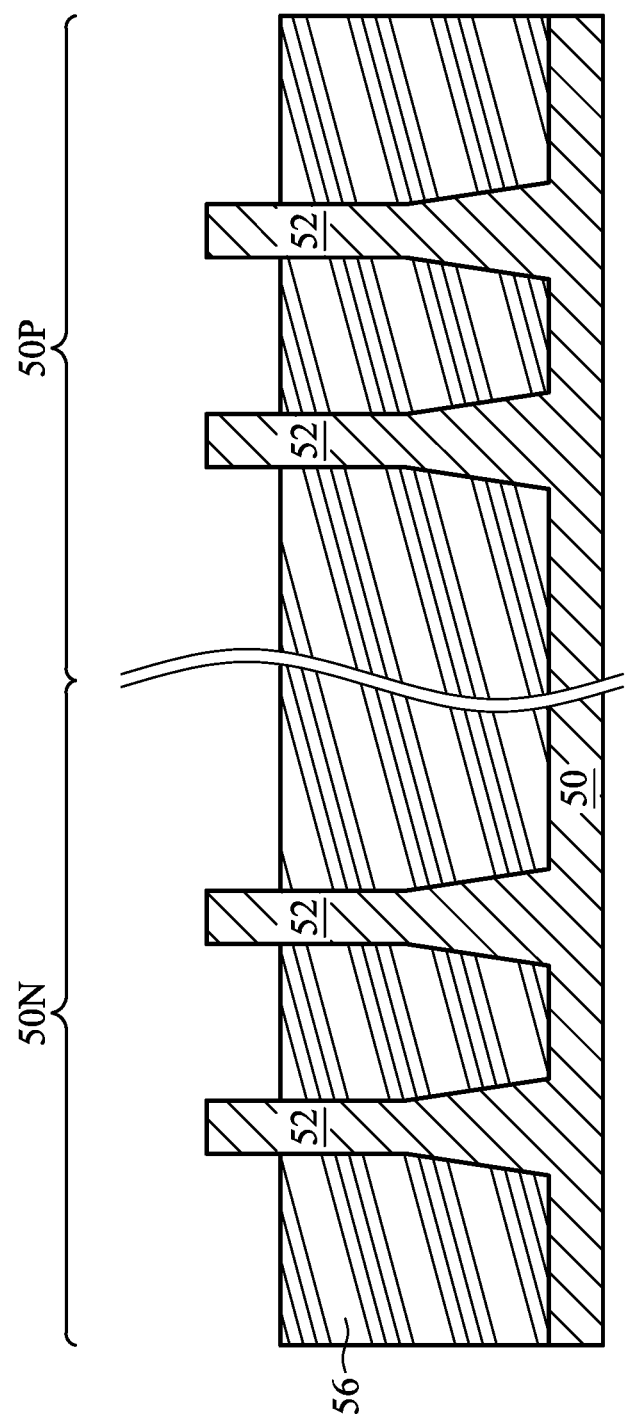

In FIG. 6, the insulation material 54 is recessed to form Shallow Trench Isolation (STI) regions 56. The insulation material 54 is recessed such that upper portions of fins 52 in the n-type region 50N and in the p-type region 50P protrude from between neighboring STI regions 56. Further, the top surfaces of the STI regions 56 may have a flat surface as illustrated, a convex surface, a concave surface (such as dishing), or a combination thereof. The top surfaces of the STI regions 56 may be formed flat, convex, and/or concave by an appropriate etch. The STI regions 56 may be recessed using an acceptable etching process, such as one that is selective to the material of the insulation material 54 (e.g., etches the material of the insulation material 54 at a faster rate than the material of the fins 52). For example, an oxide removal using, for example, dilute hydrofluoric (dHF) acid may be used.

The process described with respect to FIGS. 2 through 6 is just one example of how the fins 52 may be formed. In some embodiments, the fins may be formed by an epitaxial growth process. For example, a dielectric layer can be formed over a top surface of the substrate 50, and trenches can be etched through the dielectric layer to expose the underlying substrate 50. Homoepitaxial structures can be epitaxially grown in the trenches, and the dielectric layer can be recessed such that the homoepitaxial structures protrude from the dielectric layer to form fins. Additionally, in some embodiments, heteroepitaxial structures can be used for the fins 52. For example, the fins 52 in FIG. 5 can be recessed, and a material different from the fins 52 may be epitaxially grown over the recessed fins 52. In such embodiments, the fins 52 comprise the recessed material as well as the epitaxially grown material disposed over the recessed material. In an even further embodiment, a dielectric layer can be formed over a top surface of the substrate 50, and trenches can be etched through the dielectric layer. Heteroepitaxial structures can then be epitaxially grown in the trenches using a material different from the substrate 50, and the dielectric layer can be recessed such that the heteroepitaxial structures protrude from the dielectric layer to form the fins 52. In some embodiments where homoepitaxial or heteroepitaxial structures are epitaxially grown, the epitaxially grown materials may be in situ doped during growth, which may obviate prior and subsequent implantations although in situ and implantation doping may be used together.

Still further, it may be advantageous to epitaxially grow a material in n-type region 50N (e.g., an NMOS region) different from the material in p-type region 50P (e.g., a PMOS region). In various embodiments, upper portions of the fins 52 may be formed from silicon-germanium ($Si_xGe_{1-x}$, where x can be in the range of 0 to 1), silicon carbide, pure or substantially pure germanium, a III-V compound semiconductor, a II-VI compound semiconductor, or the like. For example, the available materials for forming III-V compound semiconductor include, but are not limited to, indium arsenide, aluminum arsenide, gallium arsenide, indium phosphide, gallium nitride, indium gallium arsenide, indium aluminum arsenide, gallium antimonide, aluminum antimonide, aluminum phosphide, gallium phosphide, and the like.

Further in FIG. 6, appropriate wells (not shown) may be formed in the fins 52 and/or the substrate 50. In some embodiments, a P well may be formed in the n-type region 50N, and an N well may be formed in the p-type region 50P. In some embodiments, a P well or an N well are formed in both the n-type region 50N and the p-type region 50P.

In the embodiments with different well types, the different implant steps for the n-type region 50N and the p-type region 50P may be achieved using a photoresist and/or other masks (not shown). For example, a photoresist may be formed over the fins 52 and the STI regions 56 in the n-type region 50N. The photoresist is patterned to expose the p-type region 50P of the substrate 50. The photoresist can be formed by using a spin-on technique and can be patterned using acceptable photolithography techniques. Once the photoresist is patterned, an n-type impurity implant is performed in the p-type region 50P, and the photoresist may act as a mask to substantially prevent n-type impurities from being implanted into the n-type region 50N. The n-type impurities may be phosphorus, arsenic, antimony, or the like implanted in the region to a concentration of equal to or less than $10^{18}$ cm$^{-3}$, such as between about $10^{16}$ cm$^{-3}$ and about $10^{18}$ cm$^{-3}$. After the implant, the photoresist is removed, such as by an acceptable ashing process.

Following the implanting of the p-type region 50P, a photoresist is formed over the fins 52 and the STI regions 56 in the p-type region 50P. The photoresist is patterned to expose the n-type region 50N of the substrate 50. The photoresist can be formed by using a spin-on technique and can be patterned using acceptable photolithography techniques. Once the photoresist is patterned, a p-type impurity implant may be performed in the n-type region 50N, and the photoresist may act as a mask to substantially prevent p-type impurities from being implanted into the p-type region 50P. The p-type impurities may be boron, boron fluoride, indium, or the like implanted in the region to a concentration of equal to or less than $10^{18}$ cm$^{-3}$, such as between about $10^{16}$ cm$^{-3}$ and about $10^{18}$ cm$^{-3}$. After the implant, the photoresist may be removed, such as by an acceptable ashing process.

After the implants of the n-type region 50N and the p-type region 50P, an anneal may be performed to repair implant damage and to activate the p-type and/or n-type impurities that were implanted. In some embodiments, the grown materials of epitaxial fins may be in situ doped during growth, which may obviate the implantations, although in situ and implantation doping may be used together.

Figure 7:
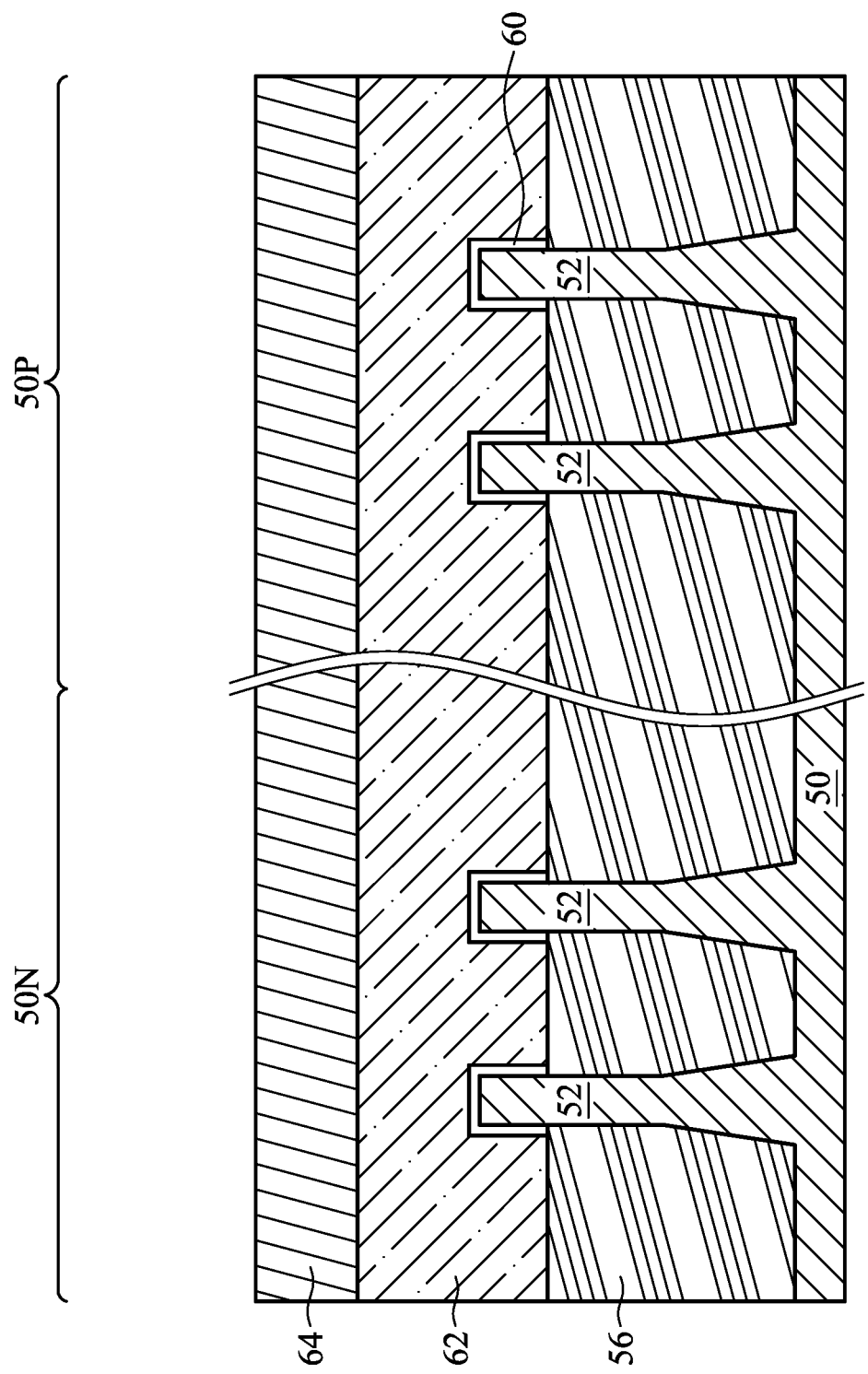

In FIG. 7, a dummy dielectric layer 60 is formed on the fins 52. The dummy dielectric layer 60 may be, for example, silicon oxide, silicon nitride, a combination thereof, or the like, and may be deposited or thermally grown according to acceptable techniques. A dummy gate layer 62 is formed over the dummy dielectric layer 60, and a mask layer 64 is formed over the dummy gate layer 62. The dummy gate layer 62 may be deposited over the dummy dielectric layer 60 and then planarized, such as by a CMP. The mask layer 64 may be deposited over the dummy gate layer 62. The dummy gate layer 62 may be a conductive or non-conductive material and may be selected from a group including amorphous silicon, polycrystalline-silicon (polysilicon), poly-crystalline silicon-germanium (poly-SiGe), metallic nitrides, metallic silicides, metallic oxides, and metals. The dummy gate layer 62 may be deposited by physical vapor deposition (PVD), CVD, sputter deposition, or other techniques for depositing the selected material. The dummy gate layer 62 may be made of other materials that have a high etching selectivity from the etching of isolation regions, e.g., the STI regions 56 and/or the dummy dielectric layer 60. The mask layer 64 may include one or more layers of, for example, silicon nitride, silicon oxynitride, or the like. In this example, a single dummy gate layer 62 and a single mask layer 64 are formed across the n-type region 50N and the p-type region 50P. It is noted that the dummy dielectric layer 60 is shown covering only the fins 52 for illustrative purposes only. In some embodiments, the dummy dielectric layer 60 may be deposited such that the dummy dielectric layer 60 covers the STI regions 56, extending over the STI regions and between the dummy gate layer 62 and the STI regions 56.

FIGS. 8A through 20B illustrate various additional steps in the manufacturing of embodiment devices. FIGS. 8A through 20B illustrate features in either of the n-type region 50N and the p-type region 50P. For example, the structures illustrated in FIGS. 8A through 20B may be applicable to both the n-type region 50N and the p-type region 50P. Differences (if any) in the structures of the n-type region 50N and the p-type region 50P are described in the text accompanying each figure. FIGS. 8C, 9C, 10C, 13C, 14C, 16C, 17A, 17B, 17C, 17D, and 18C are illustrated as plan views through the structure at the cross-section C-C illustrated in FIGS. 8A and 8B. Note that the cross-section C-C shown in FIGS. 8A and 8B is below the top surface of the channel regions 58 of the fins 52.

Figure 8A:
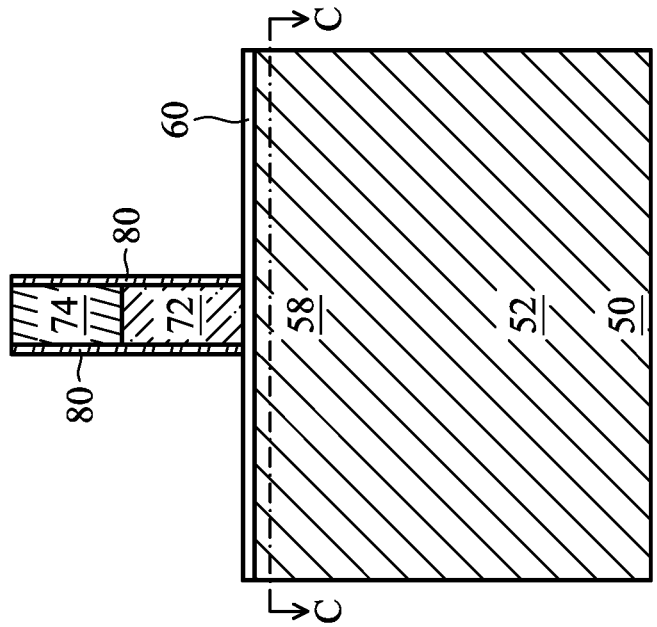
Figure 8B:
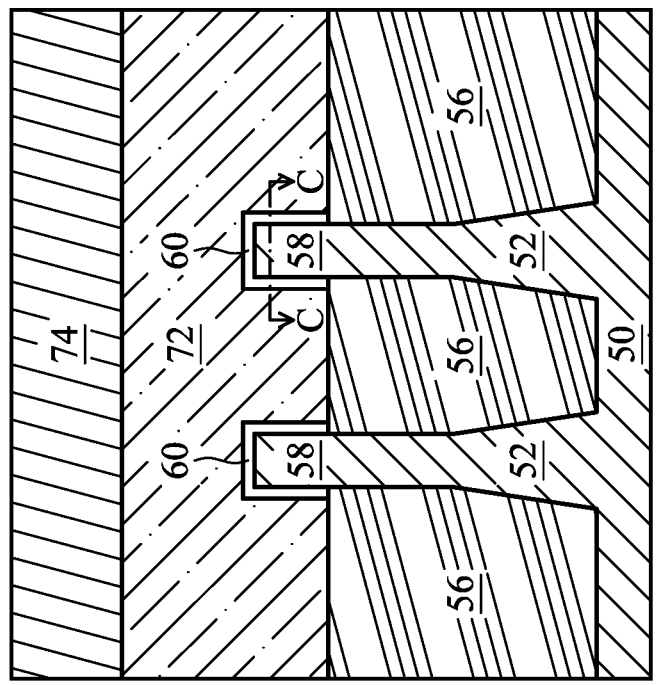
Figure 8C:
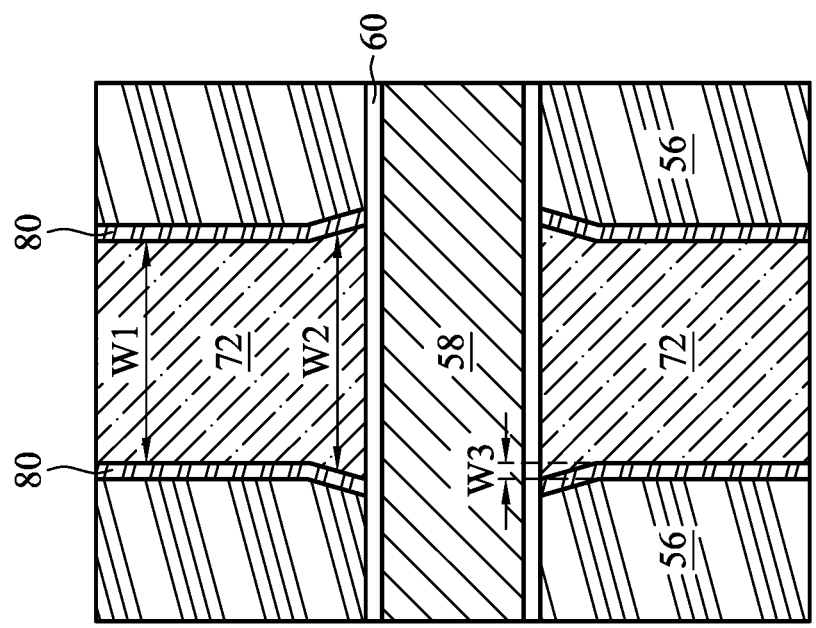

In FIGS. 8A, 8B, and 8C, the mask layer 64 (see FIG. 7) may be patterned using acceptable photolithography and etching techniques to form masks 74. The pattern of the masks 74 then may be transferred to the dummy gate layer 62. In some embodiments (not illustrated), the pattern of the masks 74 may also be transferred to the dummy dielectric layer 60 by an acceptable etching technique to form dummy gates 72. The dummy gates 72 cover respective channel regions 58 of the fins 52. The pattern of the masks 74 may be used to physically separate each of the dummy gates 72 from adjacent dummy gates. The dummy gates 72 may also have a lengthwise direction substantially perpendicular to the lengthwise direction of respective epitaxial fins 52.

Further in FIGS. 8A-C, gate seal spacers 80 can be formed on exposed surfaces of the dummy gates 72, the masks 74, and/or the fins 52. A thermal oxidation or a deposition followed by an anisotropic etch may form the gate seal spacers 80. The gate seal spacers 80 may be formed of silicon oxide, silicon nitride, silicon oxynitride, or the like.

Referring to FIG. 8C, in some embodiments, the masks 74 or dummy gates 72 may have a flared profile near the fins 52. In some cases, the flared profile may be due to topography or loading that affects the photolithography and/or etching steps that form the masks 74 or dummy gates 72. For example, in some cases, a dummy gate 72 having an aspect ratio (height:width) of about 4:1 or greater may be more likely to be formed having a flared profile near the fins 52. The dummy gates 72 may have a flared profile such that they have a width W2 near the fins 52 that is larger than a width W1 away from the fins 52. In some embodiments, regions of the dummy gates 72 that are away from the fins 52 may have a width W1 that is between about 10 nm and about 30 nm. In some embodiments, regions of the dummy gates 72 that are near the fins 52 may have a width W2 that is between about 11 nm and about 40 nm. The width W2 may be greater than the width W1 by a width W3 that is between about 1 nm and about 10 nm. In some embodiments, the width W3 may be in the range from about 10% to about 30% of the width W1. Other widths than these are possible, and the flared profile regions of the dummy gates 72 may have a different shape or size than shown. In some embodiments, the photolithography or etching steps are controlled to produce a desired flared profile of the dummy gates 72 near the fins 52, such as by appropriate choice of the aspect ratio of the dummy gates 72. In some embodiments, portions of the dummy gates 72 formed on top surfaces of the fins 52 (e.g., as shown in FIG. 8B) do not have a flared profile near the fins 52. In this manner, a dummy gate 72 may be formed having a flared profile near sidewalls of a fin 52 and not near a top surface of the fin 52. The portions of the dummy gates 72 formed on top surfaces of the fins 52 may have a width about the same as the width W1 or the width W2, or may have a different width, such as a width between the widths W1 and W2, or another width.

After the formation of the gate seal spacers 80, implants for lightly doped source/drain (LDD) regions (not explicitly illustrated) may be performed. In the embodiments with different device types, similar to the implants discussed above in FIG. 6, a mask, such as a photoresist, may be formed over the n-type region 50N, while exposing the p-type region 50P, and appropriate type (e.g., p-type) impurities may be implanted into the exposed fins 52 in the p-type region 50P. The mask may then be removed. Subsequently, a mask, such as a photoresist, may be formed over the p-type region 50P while exposing the n-type region 50N, and appropriate type impurities (e.g., n-type) may be implanted into the exposed fins 52 in the n-type region 50N. The mask may then be removed. The n-type impurities may be the any of the n-type impurities previously discussed, and the p-type impurities may be the any of the p-type impurities previously discussed. The lightly doped source/drain regions may have a concentration of impurities in the range of about $10^{15}$ cm' to about $10^{19}$ cm'. An anneal may be used to repair implant damage and to activate the implanted impurities.

Figure 9C:
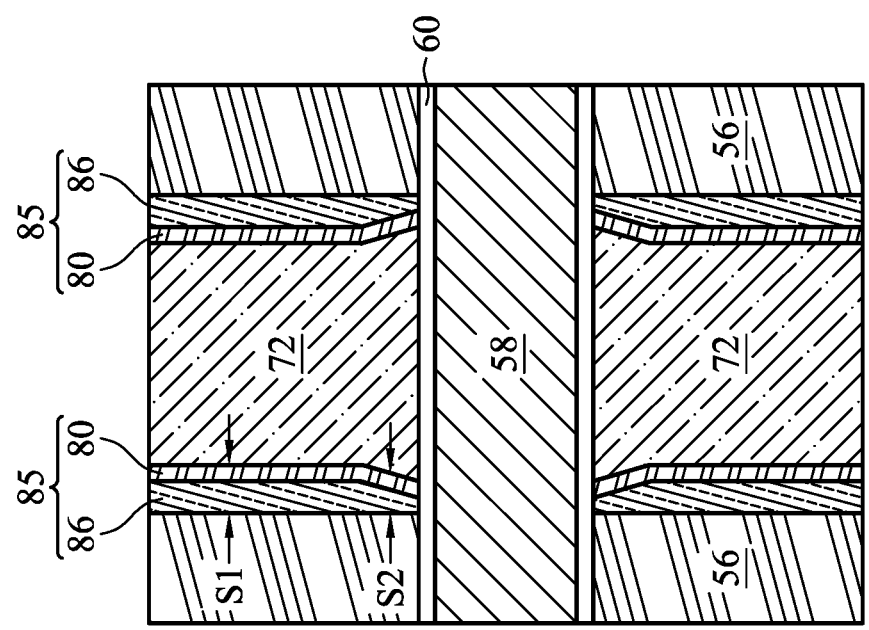

In FIGS. 9A, 9B, and 9C, gate spacers 86 are formed on the gate seal spacers 80 along sidewalls of the dummy gates 72 and the masks 74. The gate spacers 86 may be formed by conformally depositing an insulating material and subsequently anisotropically etching the insulating material. The insulating material of the gate spacers 86 may be silicon oxide, silicon nitride, silicon oxynitride, silicon carbonitride, a combination thereof, or the like. The gate spacers 86 may be formed from one layer of insulating material or from multiple layers of various insulating materials. The gate seal spacers 80 and the gate spacers 86 may be collectively referred to as spacers 85. Referring to FIG. 9C, in some embodiments, the thickness S1 of the spacers 85 in regions that are away from the fins 52 may be between about 15 Å and about 1100 Å. In some embodiments, the thickness S2 of the spacers 85 in regions that are near the fins 52 is between about 5 Å and about 1000 Å, which may be between about 10 Å and about 100 Å smaller than S1. In some embodiments, a ratio of the thicknesses S2:S1 is between about 1:1.1 and about 1:1.5. Other thicknesses or relative thicknesses are possible.

It is noted that the above disclosure generally describes a process of forming spacers and LDD regions. Other processes and sequences may be used. For example, fewer or additional spacers may be utilized or a different sequence of steps may be utilized (e.g., the gate seal spacers 80 may not be etched prior to forming the gate spacers 86, yielding "L-shaped" gate seal spacers, spacers may be formed and removed, and/or the like). Furthermore, the n-type and p-type devices may be formed using a different structures and steps. For example, LDD regions for n-type devices may be formed prior to forming the gate seal spacers 80 while the LDD regions for p-type devices may be formed after forming the gate seal spacers 80.

Figure 10B:
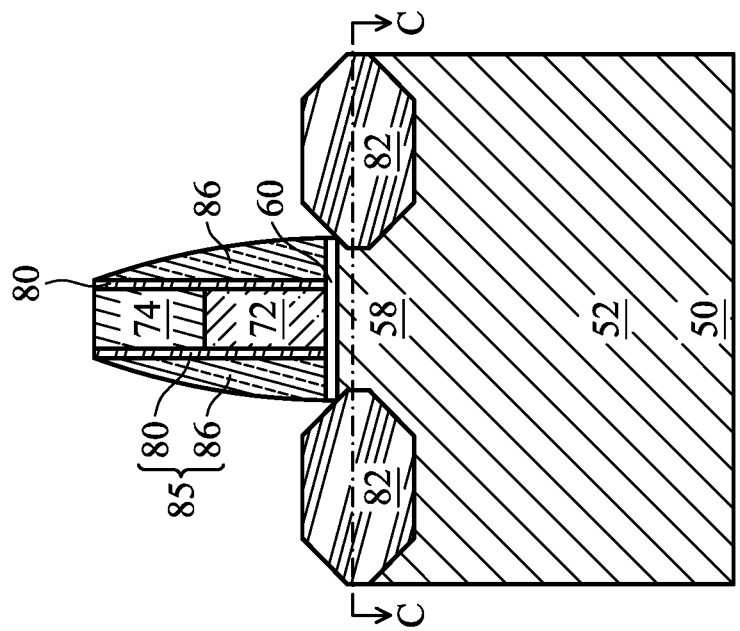
Figure 10A:
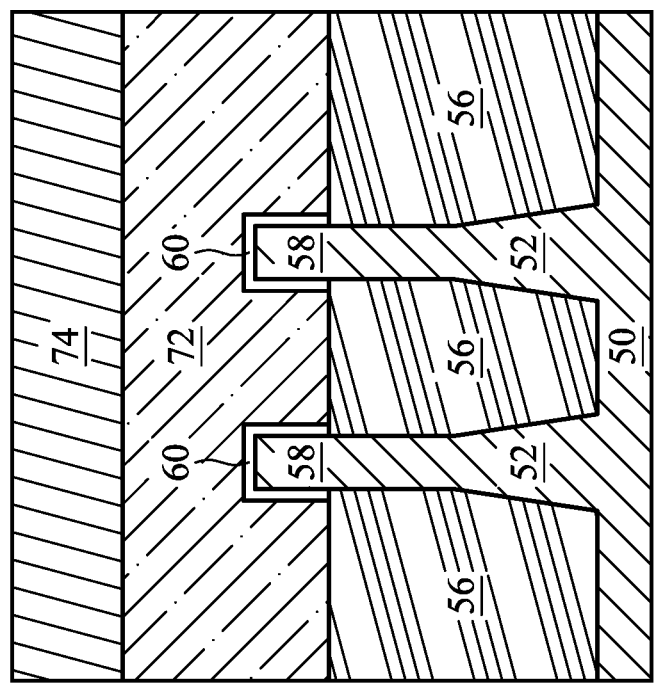
Figure 10C:
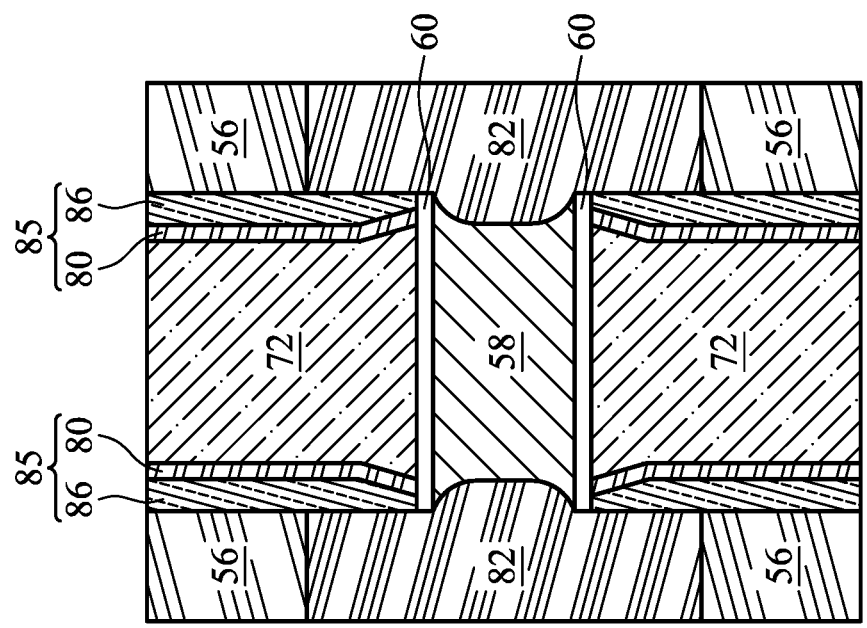
Figure 10D:
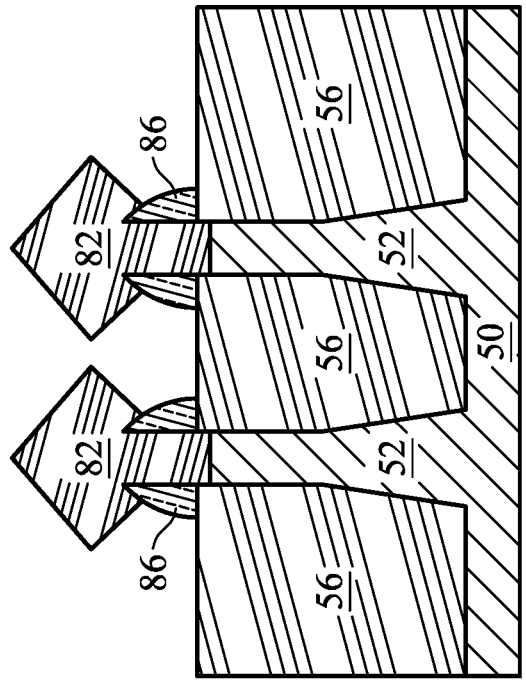
Figure 10E:
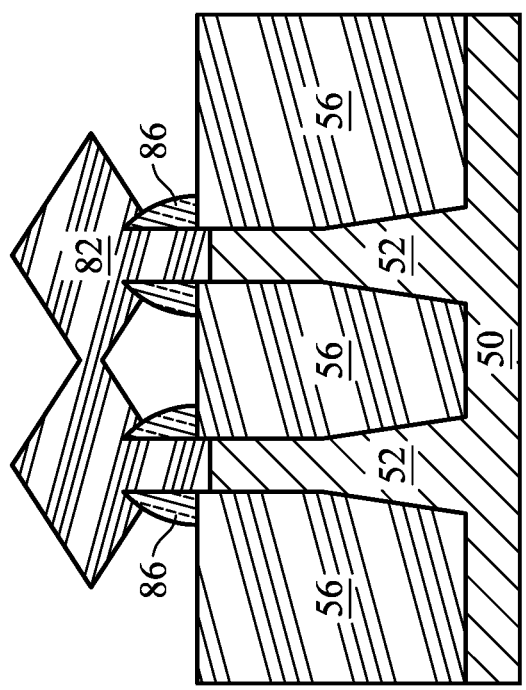

In FIGS. 10A, 10B, and 10C, epitaxial source/drain regions 82 are formed in the fins 52. The epitaxial source/drain regions 82 are formed in the fins 52 such that each dummy gate 72 is disposed between respective neighboring pairs of the epitaxial source/drain regions 82. In some embodiments the epitaxial source/drain regions 82 may extend into, and may also penetrate through, the fins 52. In some embodiments, the gate spacers 86 are used to separate the epitaxial source/drain regions 82 from the dummy gates 72 by an appropriate lateral distance so that the epitaxial source/drain regions 82 do not short out subsequently formed gates of the resulting FinFETs. In some embodiments, the epitaxial source/drain regions 82 may extend under the gate spacers 86, as shown in FIGS. 10B-C. A material of the epitaxial source/drain regions 82 may be selected to exert stress in the respective channel regions 58, thereby improving performance.

The epitaxial source/drain regions 82 in the n-type region 50N may be formed by masking the p-type region 50P and etching source/drain regions of the fins 52 in the n-type region 50N to form recesses in the fins 52. Then, the epitaxial source/drain regions 82 in the n-type region 50N are epitaxially grown in the recesses. The epitaxial source/drain regions 82 may include any acceptable material, such as appropriate for n-type FinFETs. For example, if the fin 52 is silicon, the epitaxial source/drain regions 82 in the n-type region 50N may include materials exerting a tensile strain in the channel region 58, such as silicon, silicon carbide, phosphorous doped silicon carbide, silicon phosphide, or the like. The epitaxial source/drain regions 82 in the n-type region 50N may have surfaces raised from respective surfaces of the fins 52 and may have facets.

The epitaxial source/drain regions 82 in the p-type region 50P may be formed by masking the n-type region 50N and etching source/drain regions of the fins 52 in the p-type region 50P to form recesses in the fins 52. Then, the epitaxial source/drain regions 82 in the p-type region 50P are epitaxially grown in the recesses. The epitaxial source/drain regions 82 may include any acceptable material, such as appropriate for p-type FinFETs. For example, if the fin 52 is silicon, the epitaxial source/drain regions 82 in the p-type region 50P may comprise materials exerting a compressive strain in the channel region 58, such as silicon-germanium, boron doped silicon-germanium, germanium, germanium tin, or the like. The epitaxial source/drain regions 82 in the p-type region 50P may have surfaces raised from respective surfaces of the fins 52 and may have facets.

The epitaxial source/drain regions 82 and/or the fins 52 may be implanted with dopants to form source/drain regions, similar to the process previously discussed for forming lightly-doped source/drain regions, followed by an anneal. The source/drain regions may have an impurity concentration of between about $10^{19}$ cm$^{-3}$ and about $10^{21}$ cm$^{-3}$. The n-type and/or p-type impurities for source/drain regions may be any of the impurities previously discussed. In some embodiments, the epitaxial source/drain regions 82 may be in situ doped during growth.

FIGS. 10D and 10E illustrate cross-sections of a FinFET along reference cross-section D-D. As a result of the epitaxy processes used to form the epitaxial source/drain regions 82 in the n-type region 50N and the p-type region 50P, upper surfaces of the epitaxial source/drain regions have facets which expand laterally outward beyond sidewalls of the fins 52. In some embodiments, these facets cause adjacent source/drain regions 82 of a same FinFET to merge, as illustrated by FIG. 10D. In other embodiments, adjacent source/drain regions 82 remain separated after the epitaxy process is completed as illustrated by FIG. 10D. In the embodiments illustrated in FIGS. 10C and 10D, gate spacers 86 are formed covering a portion of the sidewalls of the fins 52 that extend above the STI regions 56 thereby blocking the epitaxial growth. In some other embodiments, the spacer etch used to form the gate spacers 86 may be adjusted to remove the spacer material to allow the epitaxially grown region to extend to the surface of the STI region 56.

Figure 11B:
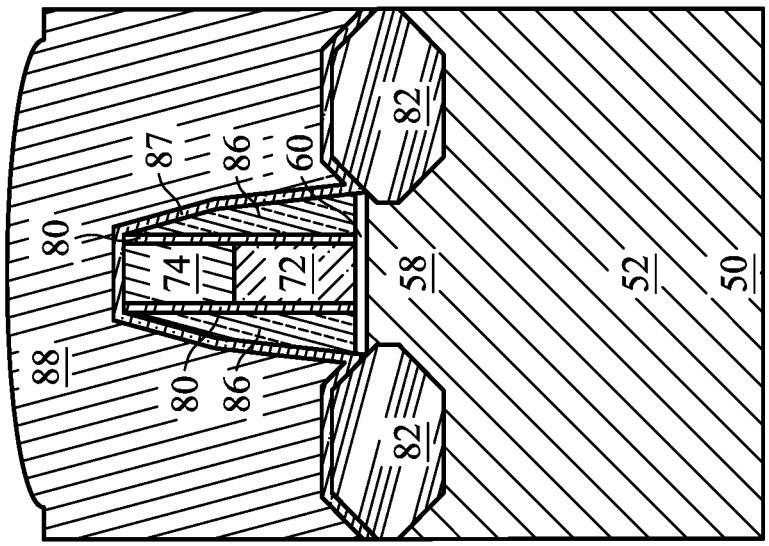
Figure 11A:
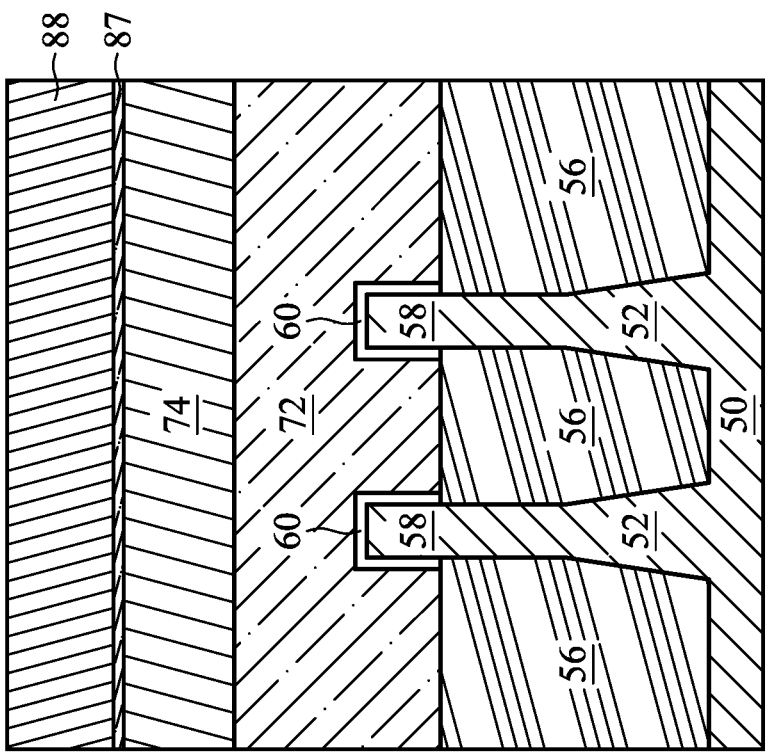

In FIGS. 11A and 11B, a first interlayer dielectric (ILD) 88 is deposited over the structure illustrated in FIGS. 10A and 10B. The first ILD 88 may be formed of a dielectric material, and may be deposited by any suitable method, such as CVD, plasma-enhanced CVD (PECVD), or FCVD. Dielectric materials may include phospho-silicate glass (PSG), boro-silicate glass (BSG), boron-doped phospho-silicate glass (BPSG), undoped silicate glass (USG), or the like. Other insulation materials formed by any acceptable process may be used. In some embodiments, a contact etch stop layer (CESL) 87 is disposed between the first ILD 88 and the epitaxial source/drain regions 82, the masks 74, and the gate spacers 86. The CESL 87 may comprise a dielectric material, such as, silicon nitride, silicon oxide, silicon oxynitride, or the like, having a lower etch rate than the material of the overlying first ILD 88.

Figure 12B:
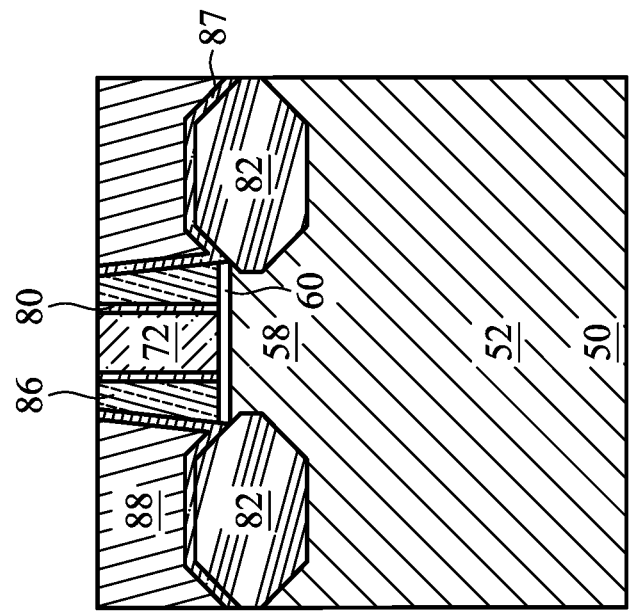
Figure 12A:
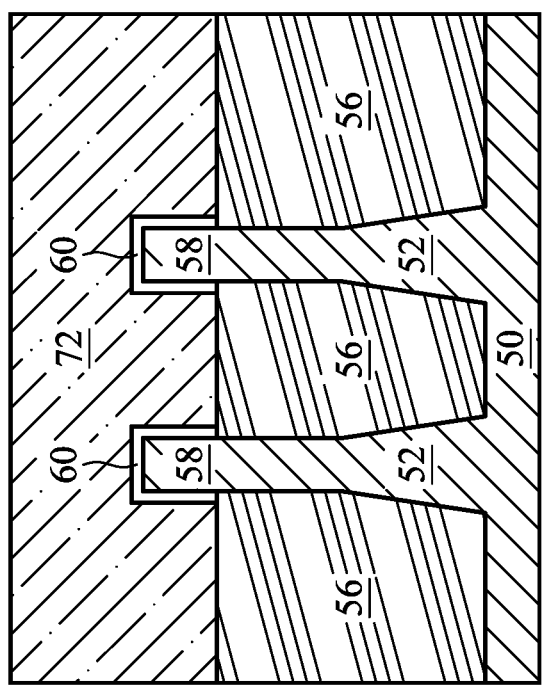

In FIGS. 12A and 12B, a planarization process, such as a CMP, may be performed to level the top surface of the first ILD 88 with the top surfaces of the dummy gates 72 or the masks 74. The planarization process may also remove the masks 74 on the dummy gates 72, and may remove portions of the gate seal spacers 80 and the gate spacers 86 along sidewalls of the masks 74. After the planarization process, top surfaces of the dummy gates 72, the gate seal spacers 80, the gate spacers 86, and the first ILD 88 may be level. Accordingly, the top surfaces of the dummy gates 72 are exposed through the first ILD 88. In some embodiments, the masks 74 may remain, in which case the planarization process levels the top surface of the first ILD 88 with the top surfaces of the masks 74.

Figure 13B:
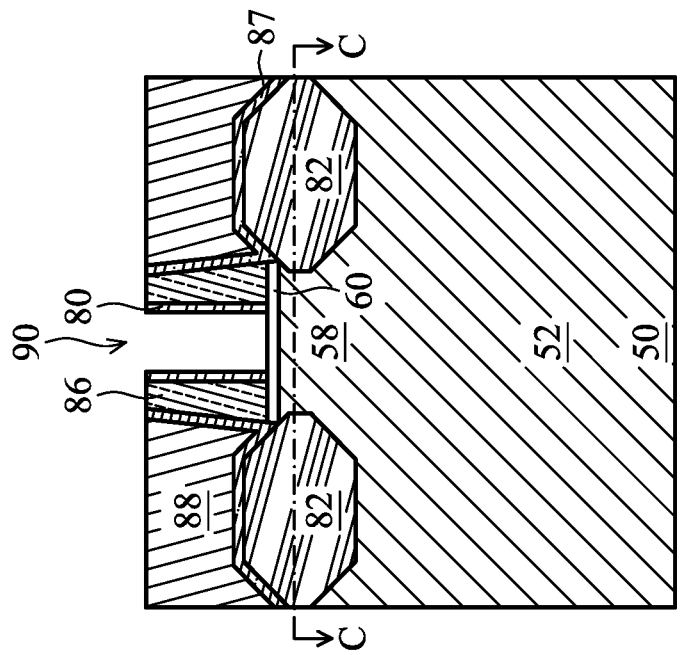
Figure 13A:
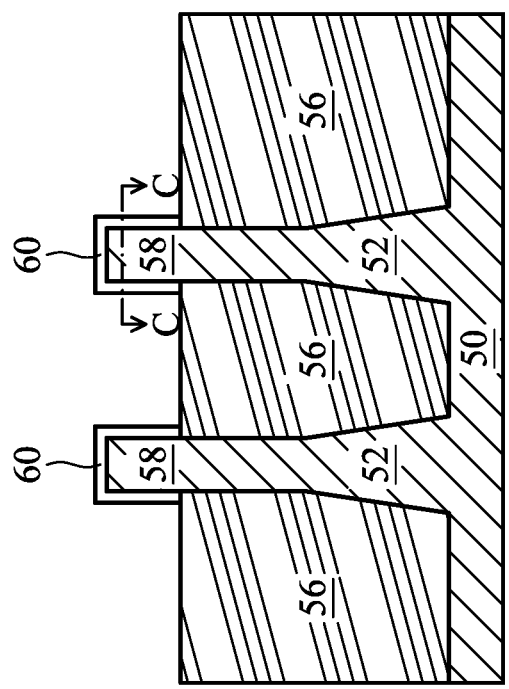
Figure 13C:
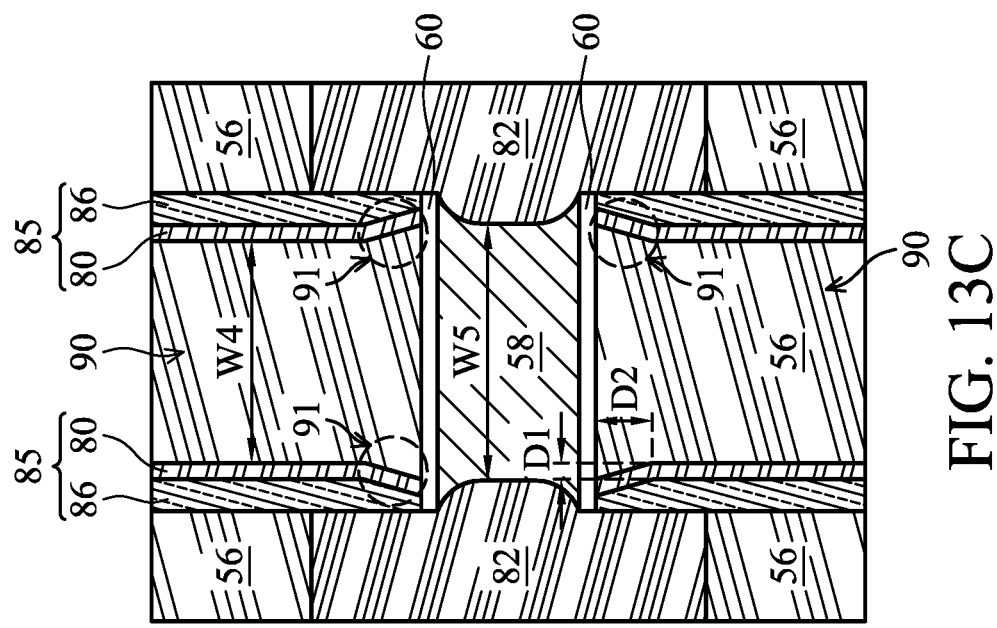

In FIGS. 13A, 13B, and 13C, the dummy gates 72 and the masks 74 (if present) are removed in an etching step(s), so that recesses 90 are formed. FIGS. 13A-B illustrate cross-sectional views along the reference cross-sections A-A and B-B, respectively. FIG. 13C illustrates a section through the channel region 58 and the epitaxial source/drain regions 82 in a plan view along the reference cross-section C-C as shown in FIGS. 13A-B. In some embodiments, the dummy gates 72 are removed, and the dummy dielectric layer 60 remains and is exposed by the recesses 90. In some embodiments, the recess 90 is laterally bounded by the dummy dielectric layer 60 and the spacers 85. Each recess 90 overlies a channel region 58 of a respective fin 52, which is disposed between neighboring pairs of the epitaxial source/drain regions 82. During the removal, the dummy dielectric layer 60 may be used as an etch stop layer when the dummy gates 72 are etched.

In some embodiments, the flared profile of the dummy gates 72 near the fins 52 results in the recesses 90 having a flared profile near the fins 52 as illustrated in FIG. 13C. For example, regions of the recesses 90 near the fins 52 may have a width W5 that is larger than a width W4 of regions of the recesses 90 away from the fins 52. In some embodiments, regions of the recesses 90 that are away from the fins 52 may have a width W4 that is about the same as the width W1 (see FIG. 8C). In some embodiments, regions of the recesses 90 that are near the fins 52 may have a width W5 that is between about 100 Å and about 300 Å, which may be between about 1 Å and about 1200 Å greater than the width W3. In this manner, the recesses 90 may have corner regions 91 adjacent the fins 52 that protrude laterally relative to regions of the recesses 90 that are away from the fins 52. The recesses 90 may extend closer to the epitaxial source/drain regions 82 than regions of the recesses 90 that are away from the fins 52. Example corner regions 91 are indicated in FIG. 13C.

In some embodiments, the corner regions 91 may protrude a distance D1 along the fins 52 that is between about 0.5 Å and about 600 Å, and may extend a distance D2 perpendicular to the fins 52 that is between about 0.5 Å and about 600 Å. Other distances are possible. In other embodiments, the corner regions 91 may have a different shape or size than shown in FIG. 13C. For example, the sidewalls of the spacers 85 at the corner regions 91 may be straight, curved, concave, convex, irregular, etc.

In some embodiments, the dummy gates 72 are removed by an anisotropic dry etch process. The anisotropic dry etching process may include using reaction gas(es) that selectively etch the dummy gates 72 without significantly etching the first ILD 88 or the gate spacers 86. In some embodiments, the anisotropic dry etching process includes generating a plasma with a power between about 10 Watts and about 1000 Watts. The anisotropic dry etching process may be performed at a pressure between about 5 mTorr and about 500 mTorr and at a process temperature between about 40° C. and about 100° C. The anisotropic dry etching process may include a bias power between about 10 Watts and about 800 Watts. In some embodiments, the anisotropic dry etching process may use one or more process gases such as $HBr$, $Cl_2$, $H_2$, $N_2$, $O_2$, $C_xF_y$, $CH_xF_y$, the like, or combinations thereof. For example, in some embodiments, the anisotropic etching process includes flowing HBr at a flow rate between about 10 sccm and about 500 sccm, flowing $Cl_2$ at a flow rate between about 10 sccm and about 200 sccm, flowing He at a flow rate between about 50 sccm and about 1000 sccm, flowing $CF_4$ at a flow rate between about 1 sccm and about 50 sccm, flowing $CH_2F_2$ at a flow rate between about 5 sccm and about 20 sccm, and/or flowing $O_2$ at a flow rate between about 5 sccm and about 20 sccm. Other process gases or process conditions are possible.

Figure 14B:
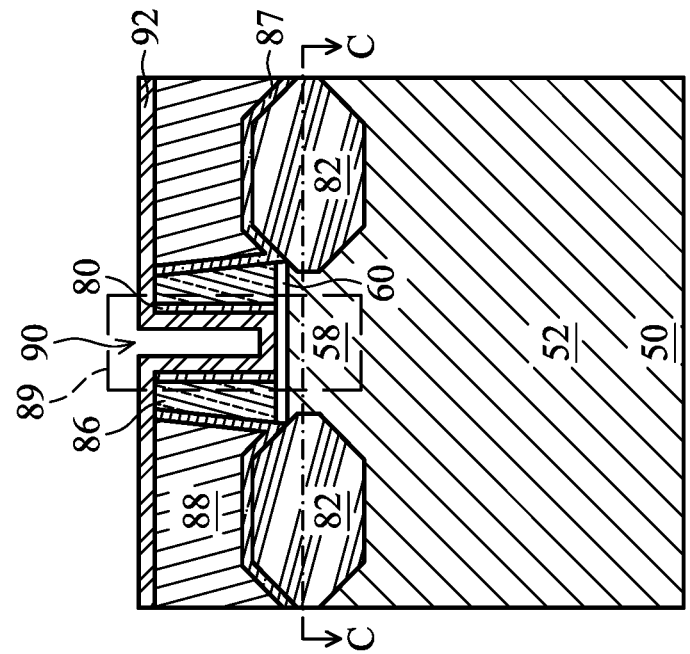
FIGS. 14A, 14B, and 14C are various views of an intermediate stage in the deposition of a dielectric layer in the manufacturing of FinFETs, in accordance with some embodiments.
Figure 14A:
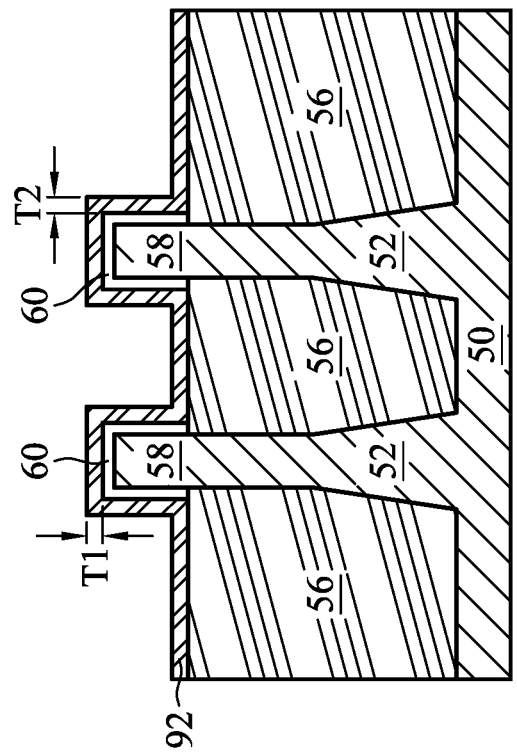
Figure 14C:
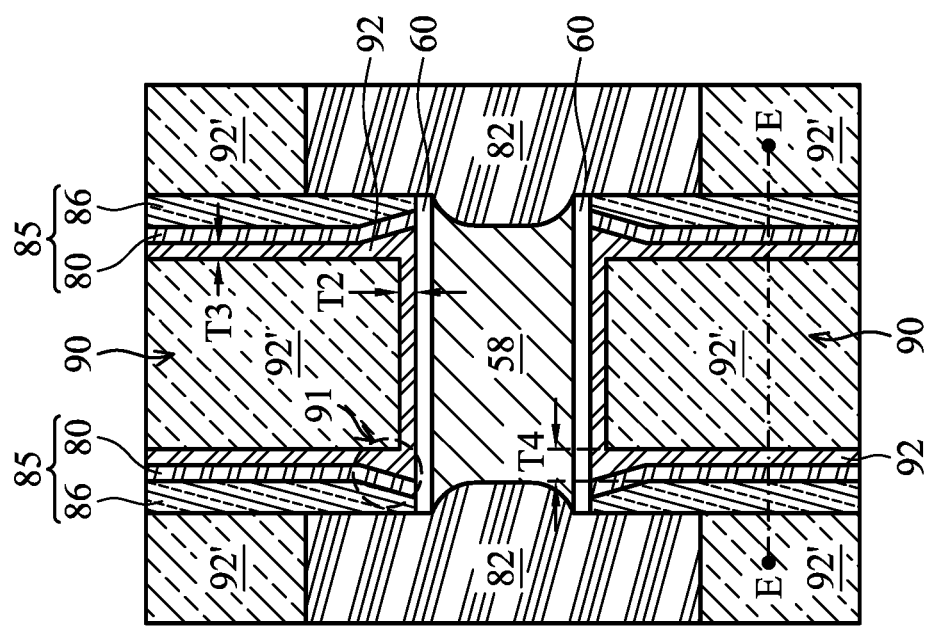
Figure 15A:
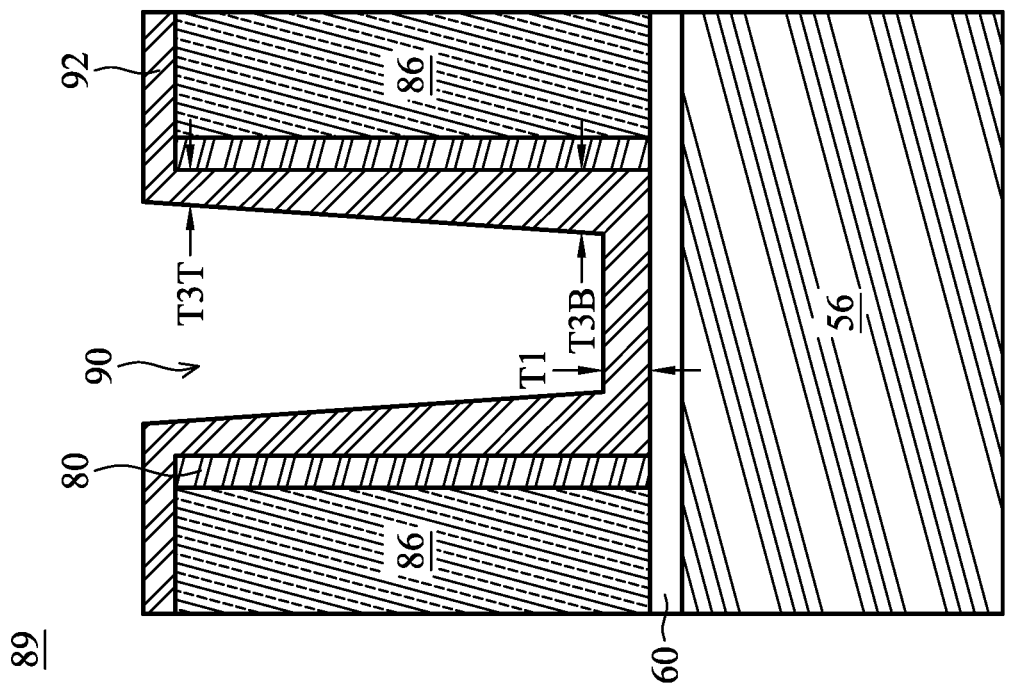
FIGS. 15A, 15B, and 15C are cross-sectional views of an intermediate stage in the deposition of a dielectric layer in the manufacturing of FinFETs, in accordance with some embodiments.
Figure 15B:
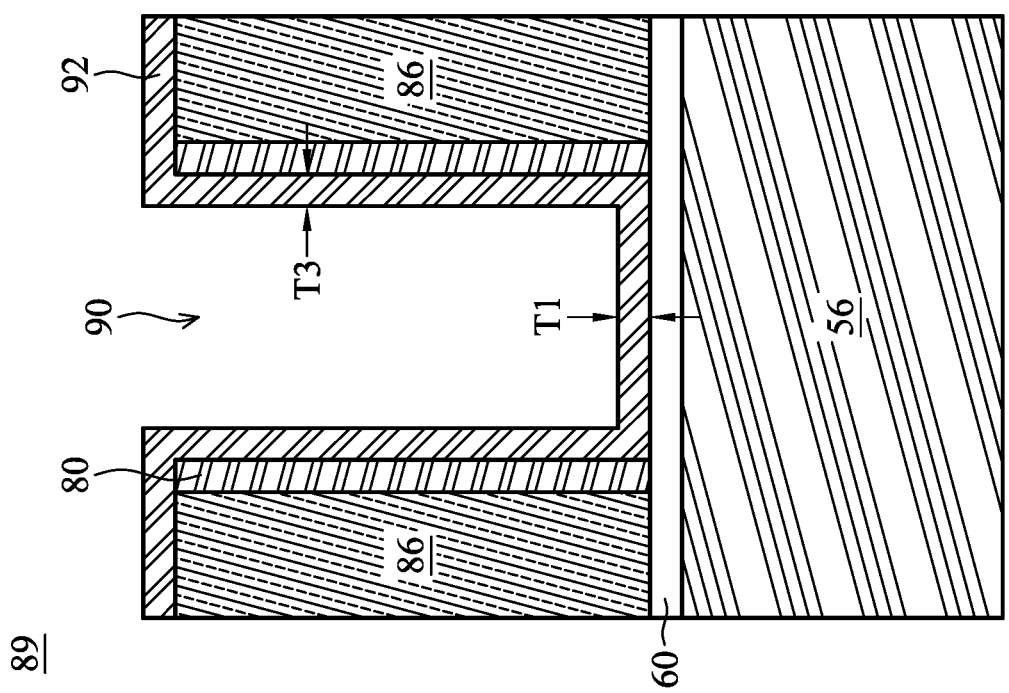
Figure 15C:
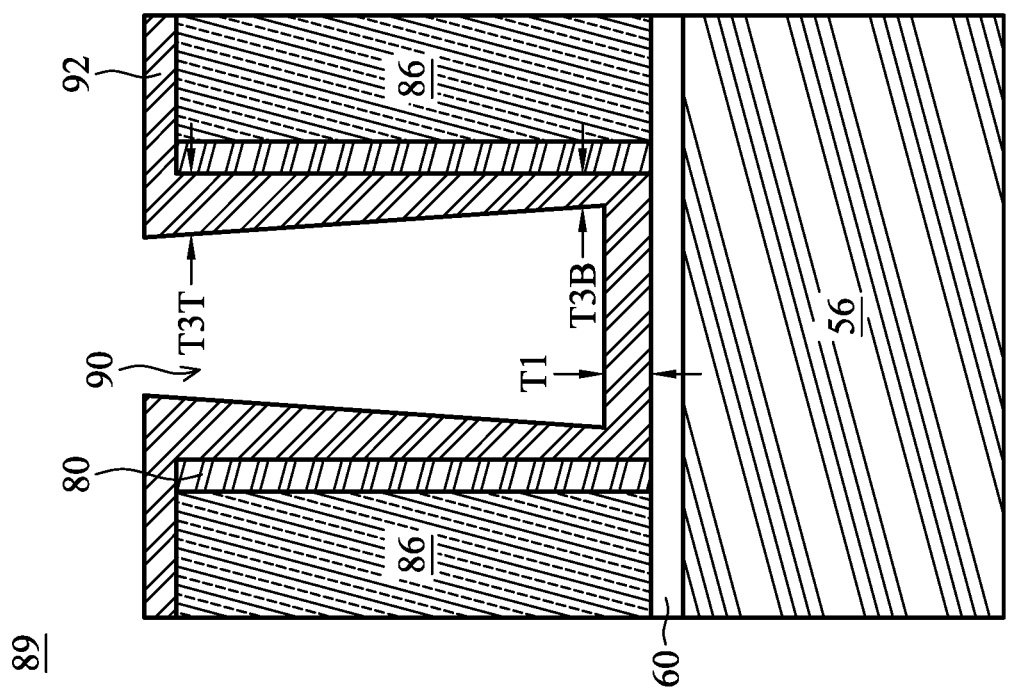

In FIGS. 14A, 14B, and 14C, a dielectric layer 92 is deposited over the structure and within the recesses 90, in accordance with some embodiments. The dielectric layer 92 may be deposited as a conformal layer that extends over the STI regions 56, the ILD 88, the CESL 87, the gate seal spacers 80, and the gate spacers 86. The dielectric layer 92 may extend along sidewalls of the recesses 90 and over the dummy dielectric layer 60 within the recesses 90. In FIG. 14C, portions of the dielectric layer 92 deposited on sidewalls are indicated as dielectric layer 92, and portions deposited on top surfaces (e.g., lateral surfaces) are indicated as dielectric layer 92'. In some embodiments, the dielectric layer 92 is formed having a thickness T1 on the top surfaces of the dummy dielectric layer 60 within the recesses 90 that is between about 0.5 Å and about 300 Å. The dielectric layer 92 may have a thickness T2 on sidewalls of the dummy dielectric layer 60 that is between about 0.5 Å and about 300 Å. In some embodiments, the dielectric layer 92 is formed on sidewalls of the gate spacers 85 having a thickness T3 that is between about 0.5 Å and about 300 Å. The thicknesses T1, T2, and/or T3 may be similar thicknesses or may be different thicknesses. As shown in FIG. 14C, the dielectric layer 92 fills or partially fills the corner regions 91 of the recesses 90. Filling the corner regions 91 with the dielectric layer 92 allows for the formation of corner spacers 94, which are described in greater detail for FIGS. 16A-C. As such, the amount of dielectric layer 92 material that is deposited may be based on the size of the corner regions 91. In some embodiments, the dielectric layer 92 laterally fills the corner regions 91 to a thickness T4 measured from the corner of the corner regions 91. The thickness T4 may be between about 0.5 Å and about 600 Å, and may be greater than, less than, or about the same as the distance D1 (see FIG. 13C). Other thicknesses are possible.

The dielectric layer 92 may be formed having a substantially uniform thickness along a surface or may be formed having a varying thicknesses on along a surface. For example, the dielectric layer 92 may be formed having a thickness profile on sidewalls of the recess 90 which is uniform or which varies, such as being thickest near the top of the recess 90 or thickest near the bottom of the recess 90. Other thickness profiles are possible, such as forming a dielectric layer 92 that has vertical surfaces, angled surfaces, straight surfaces, curved surfaces, convex surfaces, concave surfaces, irregular surfaces, etc. In some embodiments, the thickness profile of the dielectric layer 92 is controlled by controlling parameters or characteristics of the deposition process. For example, a more conformal deposition process may produce a thickness profile similar to that shown in FIG. 15A (described in greater detail below), or a less conformal deposition process may produce a thickness profile similar to that shown in FIG. 15B or 15C (described in greater detail below). In some embodiments, the thickness profile of the dielectric layer 92 may be controlled, for example, to ensure that the corner regions 91 are completely filled, or to facilitate formation of corner spacers 94 (see FIG. 16C) having a desired size, shape, or thickness profile. The formation of corner spacers 94 with particular thickness profiles is discussed in greater detail below for FIG. 16C.

As examples, FIGS. 15A, 15B, and 15C illustrate dielectric layers 92 having different thickness profiles, in accordance with some embodiments. FIGS. 15A-C illustrate cross-sectional views along the reference cross-section E-E indicated in FIG. 1 and FIG. 14C. FIG. 15A shows a dielectric layer 92 having a substantially uniform thickness on the bottom and the sidewalls of the recess 90, similar to the dielectric layer 92 shown in FIGS. 14A-C. For example, the dielectric layer 92 shown in FIG. 15A may have a substantially uniform thickness T1 on the dummy dielectric layer 60 and a substantially uniform thickness T3 on sidewalls of the gate spacers 85. The thicknesses T1 and T3 may be similar or different thicknesses.

FIG. 15B illustrates a dielectric layer 92 having a thickness profile such that the dielectric layer 92 has a greater thickness near the bottom of the recess 90 and a smaller thickness near the top of the recess 90. For example, the dielectric layer 92 may have a top thickness T3T near the top of the recess 90 that is smaller than a bottom thickness T3B near the bottom of the recess 90. In some embodiments, the top thickness T3T may be between about 5% and about 95% of the bottom thickness T3B. In some embodiments, the dielectric layer 92 may have a thickness T1 on the dummy dielectric layer 60 that is greater than the top thickness T3T, and which may be similar to the bottom thickness T3B. Other relative thicknesses are possible.

FIG. 15C illustrates a dielectric layer 92 having a thickness profile such that the dielectric layer 92 has a greater thickness near the top of the recess 90 and a smaller thickness near the bottom of the recess 90. For example, the dielectric layer 92 may have a top thickness T3T near the top of the recess 90 that is greater than a bottom thickness T3B near the bottom of the recess 90. In some embodiments, the bottom thickness T3B may be between about 5% and about 95% of the top thickness T3T. In some embodiments, the dielectric layer 92 may have a thickness T1 on the dummy dielectric layer 60 that is smaller than the top thickness T3T, and which may be similar to the bottom thickness T3B. Other relative thicknesses are possible.

The dielectric layer 92 may be a dielectric material, such as an oxide, a nitride, or the like. In some embodiments, the dielectric material is a silicon-based material, such as silicon oxide, silicon carbide, silicon oxycarbide, silicon oxynitride, silicon oxycarbonitride, or the like. Other dielectric materials are possible. In some embodiments, the dielectric layer 92 includes multiple layers of different dielectric materials. In some embodiments, the dielectric layer 92 is a material which may be selectively etched over the materials of other features, such as the gate spacers 85, the channel region 58. The dielectric layer 92 may be deposited using a suitable deposition process, such as CVD, PECVD, PVD, ALD, the like, or combinations thereof.

Figure 16B:
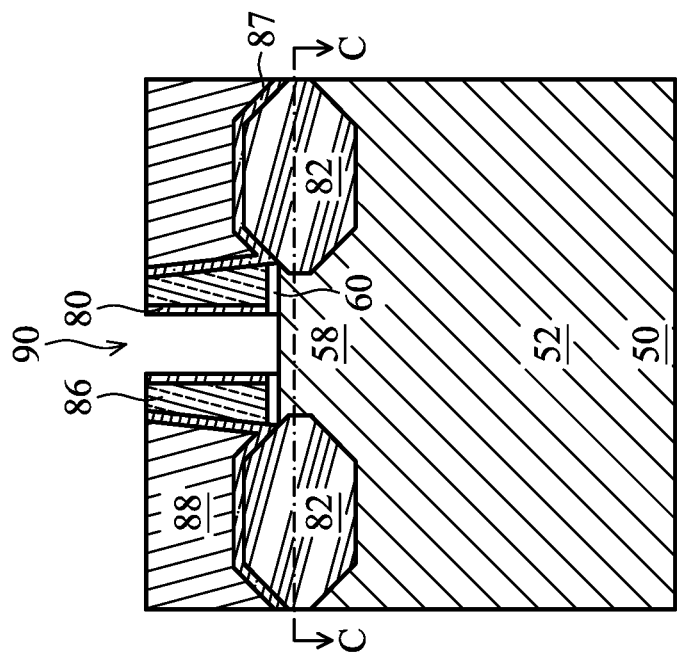
FIGS. 16A, 16B, and 16C are various views of an intermediate stage in the formation of corner spacers in the manufacturing of FinFETs, in accordance with some embodiments.
Figure 16A:
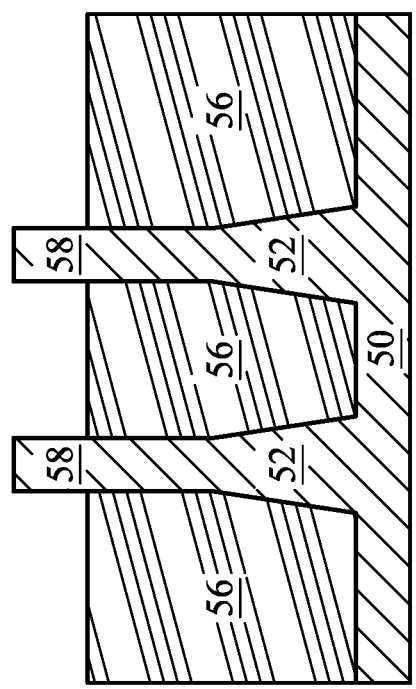
Figure 16C:
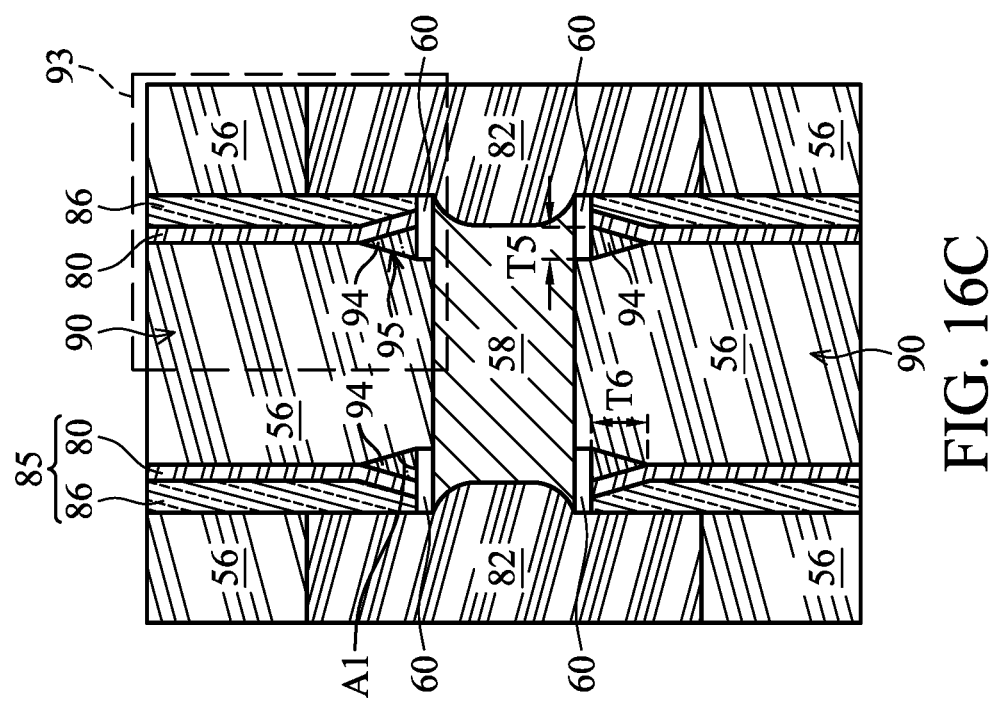

In FIGS. 16A, 16B, and 16C, an etching process is performed to etch the dielectric layer 92 and form corner spacers 94, in accordance with some embodiments. The etching process removes the dielectric layer 92 from the bottom surfaces and the sidewall surfaces of the recesses 90, but incompletely etches the dielectric layer 92 in and near the corner regions 91, in some embodiments. The etching process may also remove the dielectric layer 92 from top surfaces of the STI regions 56, the ILD 88, the CESL 87, the gate seal spacers 80, and/or the gate spacers 86. In this manner, portions of the dielectric layer 92 are left remaining in the corner regions 91 after performing the etching process. In some cases, the narrow geometry of the corner regions 91 and/or the relatively thicker dielectric layer 92 within the corner regions 91 may allow for a slower etch rate of the dielectric layer 92 near the corner regions 91 than away from the corner regions 91. In some embodiments, the etching process may be controlled to halt etching after portions of the dielectric layer 92 away from the corner regions 91 have been removed but before portions of the dielectric layer 92 near the corner regions 91 have been removed. In this manner, the dielectric layer 92 within the corner regions 91 may be incompletely etched. The remaining portions of the dielectric layer 92 partially or completely fill the corner regions 91, and are referred to herein as corner spacers 94. In some embodiments, the etching process may also etch through the dummy dielectric layer 60 to expose the channel region 58, as shown in FIGS. 16A-C.

As shown in FIG. 16C, the corner spacers 94 cover portions of the spacers 85 and/or the dummy dielectric layer 60 near the corner regions 91. Each corner spacer 94 has a sidewall 95 that extends from a gate spacer 85 to the dummy dielectric layer 60. In some embodiments, the corner spacers 94 may extend along the fins 52 (e.g., along the dummy dielectric layer 60) a distance T5 that is between about 0.5 Å and about 600 Å, and may extend perpendicular to the fins 52 (e.g., along the gate spacers 85) a distance T6 between about 0.5 Å and about 600 Å. In some embodiments, the distance T5 is greater than the distance D1 (see FIG. 13C) of the corner regions 91, but may be about the same as or less than the distance D1 in other embodiments. The distance T6 may be greater than, about the same as, or less than the distance D2 (see FIG. 13C) of the corner regions 91. Other distances are possible. In some embodiments, the sidewall 95 may have an angle A1 with the dummy dielectric layer 60 that is between about 10° and about 90°.

In some embodiments, the corner spacers 94 have a substantially uniform size (e.g., distances T5, distance T6, and/or cross-sectional area) or a substantially uniform shape along a vertical direction from the near the top of the recess 90 to near the bottom of the recess 90. In other embodiments, the corner spacers 94 may have varying size, shape, or cross-sectional area along a vertical direction. For example, in some embodiments, depositing a dielectric layer 92 that has a greater thickness near the bottom of the recess 90, such as shown in FIG. 15B, may allow the formation of corner spacers 94 that have a larger size near the top of the recess 90 than near the bottom of the recess 90. Similarly, depositing a dielectric layer 92 that has a greater thickness near the bottom of the recess 90, such as shown in FIG. 15C, may allow the formation of corner spacers 94 that have a larger size (e.g., greater distances T5 and/or T6) near the bottom of the recess 90 than near the top of the recess 90. In this manner, the separation distance S3 between a gate electrode 98 and an epitaxial source/drain regions 82 (see FIG. 18C) may be controlled to be different distances at different locations along a vertical direction, which can allow for greater control of the capacitance between the gate electrode 98 and the epitaxial source/drain region 82, described in greater detail below.

FIG. 16C illustrates the corner spacers 94 as having an approximately triangular shape with a straight sidewall 95, but the corner spacers 94 may be formed having other shapes. For example, the sidewall 95 may have a curved shape, a convex shape, a concave shape, an irregular shape, the like, or a combination thereof. Some examples of corner spacers 94 having different shapes are described below for FIGS. 17A-D. The shape of the corner spacers 94 may be controlled by controlling the shape of the corner regions 91, the thickness of the dielectric layer 92, and/or the parameters of the etching process that etches the dielectric layer 92. In some cases, the shape of the sidewall 95 may be controlled to control the separation distance S3 or to control the shape of the gate dielectric layer 96 and gate electrode 98 (see FIG. 18C). For example, a convex sidewall 95 may increase the separation distance S3.

In some embodiments, the etching process that etches the dielectric layer 92 and forms the corner spacers 94 includes one or more dry etching processes, one or more wet etching processes, or a combination thereof. For example, the etching process may include a plasma etching process, which may be an isotropic etching process, an anisotropic etching process, or a combination thereof. In some embodiments, the plasma etching process includes using reaction gas(es) that selectively etch the dielectric layer 92 over other features such as the first ILD 88, the gate seal spacers 80, the gate spacers 86, etc. In some embodiments, the plasma etching process is performed in a processing chamber with process gases being supplied into the processing chamber. The process gases may include single gases or mixtures of gases. The process gases may include $CF_4$, $C_2F_6$, $CH_3F$, $C_4F_6$, $CHF_3$, $CH_2F_2$, $Cl_2$, $C_4H_6$, $BCl_3$, $SiCl_4$, $SF_6$, $HBr$, $H_2$, $NF_3$, the like, other gases, or combinations thereof. In some embodiments, the process gases may include other gases used to control the selectivity of the plasma etching process, such as $O_2$, $CO_2$, $SO_2$, $CO$, $SiCl_4$, $N_2$, the like, other gases, or combinations thereof. For example, in some cases, increasing the amount of O2 within the process gases can increase the selectivity of the plasma etching process over silicon oxide. The process gases may also include carrier gases such as Ar, He, Ne, Xe, the like, or combinations thereof.

The process gases may be flowed into the processing chamber at a rate between about 10 sccm and about 5000 sccm. The plasma etching process may performed using a bias power between about 0 Watts and about 3000 Watts, and having a plasma power between about 10 Watts and about 3000 Watts. The plasma etching process may be performed at a temperature between about 40° C. and about 100° C. A pressure in the processing chamber may be between about 1 mTorr and about 10 Torr. Other process conditions are possible. In some embodiments, the plasma is a direct plasma. In other embodiments, the plasma is a remote plasma that is generated in a separate plasma generation chamber connected to the processing chamber. Process gases may be activated into plasma by any suitable method of generating the plasma, such as using a transformer coupled plasma generator, inductively coupled plasma (ICP) systems, magnetically enhanced reactive ion techniques, electron cyclotron resonance techniques, or the like.

In some embodiments, the plasma etching process may include, for example, an Atomic Layer Etching (ALE) process, an RIE process, or another plasma process. For example, the plasma etching process may be performed using a bias power between about 100 Watts and about 800 Watts, and having a plasma power between about 10 Watts and about 500 Watts. The plasma etching process may be performed at a temperature between about 40° C. and about 100° C. A pressure in the processing chamber may be between about 5 mTorr and about 100 Torr. In some embodiments, the anisotropic etching process includes flowing HBr at a flow rate between about 10 sccm and about 500 sccm, flowing $Cl_2$ at a flow rate between about 10 sccm and about 200 sccm, flowing Ar at a flow rate between about 100 sccm and about 1000 sccm, flowing $C_4F_6$ at a flow rate between about 10 sccm and about 100 sccm, and/or flowing $O_2$ at a flow rate between about 10 sccm and about 100 sccm. Other process gases or process conditions are possible.

The etching process may be performed in a single etching step or using multiple steps. In some embodiments, a first etching process is used to etch the dielectric layer 92 to expose the dummy dielectric layer 60 and form the corner spacers 94, and then a second etching process is used to etch the exposed portions of the dummy dielectric 60. In these embodiments, the first etching process and/or the second etching process may include a single etching step or multiple etching steps. FIGS. 16A-C show an embodiment in which the dummy dielectric layer 60 is etched, but in other embodiments, the dummy dielectric layer 60 is not etched and remains over the channel region 58. In some embodiments, the dielectric layer 92 may be incompletely etched to form the corner spacers 94 by controlling the duration of time the etching process is performed. For example, the etching process (or a step of the etching process) may be performed until the dielectric layer 92 is removed from sidewalls of the gate spacers 95 and from over the channel region 58 but halted before the dielectric layer 92 is fully removed from the corner regions 91.

In some embodiments, the corner spacers 94 may be formed in one region of the substrate 50 using a separate etching process than is used to form the corner spacers 94 in another region of the substrate 50. In this manner, different regions may have corner spacers 94 of different shapes or sizes, for example. In some embodiments, the dielectric layer 92 may be etched in one region to form corner spacers 94, but the dielectric layer 92 may be completely removed in another region without forming corner spacers 94. In some embodiments, the dielectric layer 92 may be etched in one region to form corner spacers 94, but in another region the dielectric layer 92 is not etched and remains within the recesses 90. Various masking steps may be used to mask and expose appropriate regions when using distinct processes such as those described. An example embodiment in which the dielectric layer 92 is not etched in a separate region is described below for FIGS. 21A-C through FIGS. 24A-C.

Figure 17A:
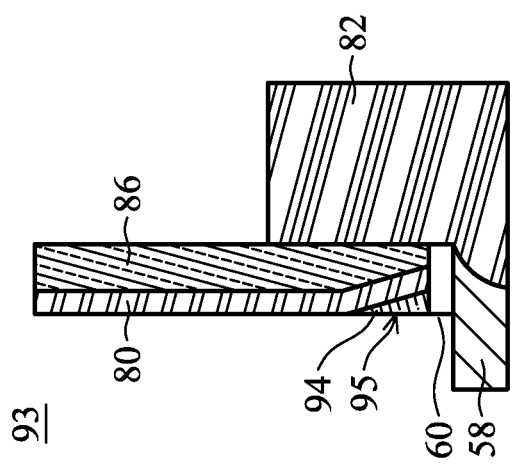
FIGS. 17A, 17B, 17C, and 17D are cross-sectional views of an intermediate stage in the deposition of a dielectric layer in the manufacturing of FinFETs, in accordance with some embodiments.
Figure 17C:
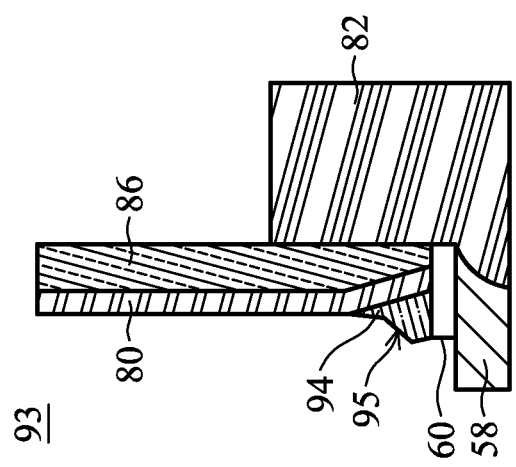
Figure 17B:
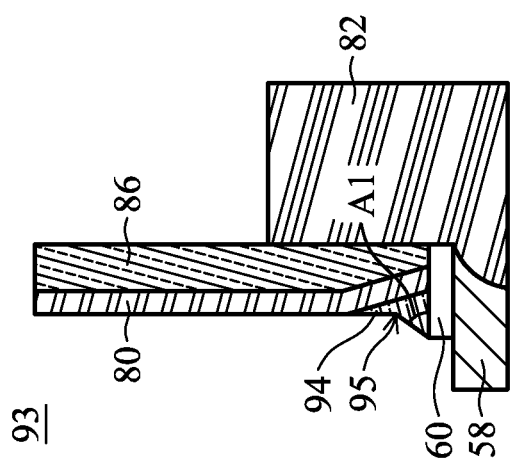
Figure 17D:
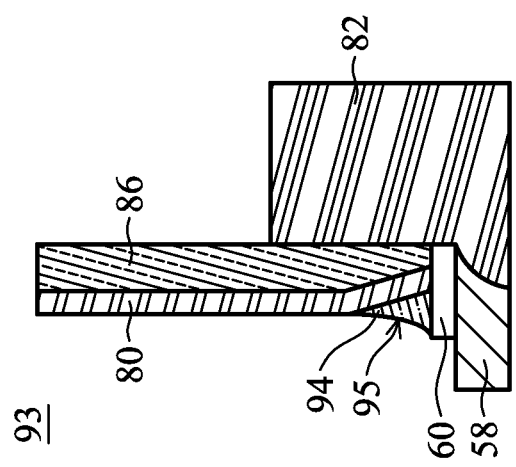

Turning to FIGS. 17A-D, corner spacers 94 having different shapes are shown, in accordance with some embodiments. FIGS. 17A-D show a detailed view of the region 93 indicated in FIG. 16C. The shapes of corner spacers 94 shown in FIGS. 17A-D or other shapes of corner spacers 94 may be controlled by controlling the parameters or characteristics of the etching process, such as controlling the over-etching, the process gas flow rates, the plasma power, the bias power, or other parameters or characteristics. FIG. 17A illustrates an example corner spacer 94 having a sidewall 95 that is concave and comprises substantially straight sections. In some cases, forming a corner spacer 94 with a concave sidewall 95 may allow for the formation of a larger gate electrode 98. The sidewall 95 may have an angle A1 with respect to the dummy dielectric layer 60. In some embodiments, an end of the sidewall 95 may be approximately flush with the gate spacer 85, as shown in FIG. 17A. In other embodiments, an end of the sidewall 95 may have an angle with respect to the gate spacer 85. FIG. 17B illustrates an example corner spacer 94 having a sidewall 95 that is concave and curved. In some embodiments, increasing the bias power and/or increasing the amount of over-etching by increasing the process time or the plasma power can form a corner spacer 94 having a more concave or curved sidewall. FIG. 17C illustrates an example corner spacer 94 with a sidewall 95 that is substantially flush with the spacer 85. In this manner, the corner spacer 94 fills the corner region 91 but does not extend significantly outside of the corner region 91, and thus the corner spacer 94 has a cross-sectional area similar to that of the corner region 91. In some embodiments, increasing the amount of over-etching can form a corner spacer 94 that extends less outside of the corner region 91 (e.g., forms a smaller corner spacer 94). In some embodiments, a corner spacer 94 that is more flush with a sidewall of the gate spacers 85 (e.g., with the gate seal spacers 80) by increasing the bias power of the etching process. In other embodiments, the corner spacer 94 may incompletely fill a corner region 91 or may protrude outside of a corner region 91. FIG. 17D illustrates an example corner spacer 94 having an irregular shape. As shown in FIG. 17D, a corner spacer 94 may have a sidewall 95 that is approximately flush with the etched sidewall of the dummy dielectric layer 60, which can allow for a larger separation distance S3 (see FIG. 18C). The sidewall 95 shown in FIG. 17D includes a convex region, which can also allow for a larger separation distance S3. As described below, a larger separation distance S3 can allow for reduced parasitic capacitance and improve device performance. In some embodiments, an irregular profile may be formed by controlling the relative strengths of the over-etching and the bias power. The corner spacers 94 shown in FIG. 17A-D are examples. Corner spacers 94 and their sidewalls 95 having other sizes or shapes are possible, and all such variations are considered within the scope of the present disclosure.

Figure 18B:
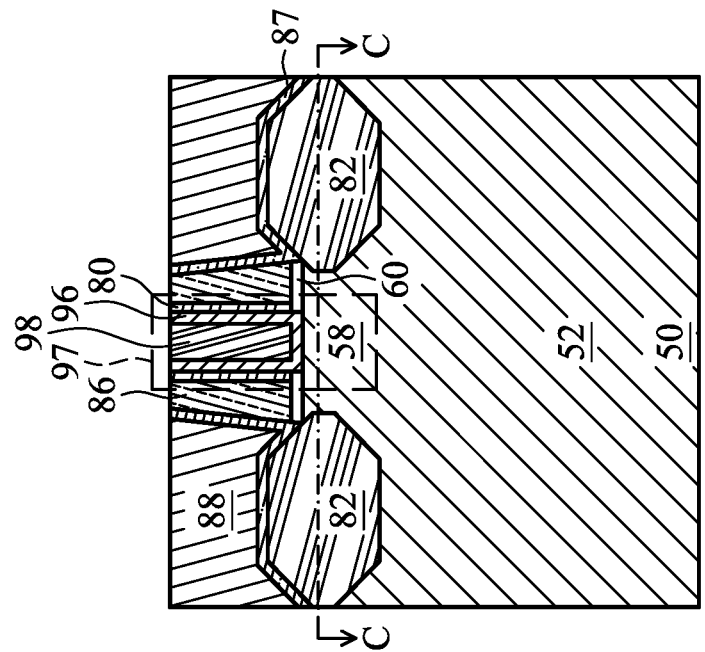
FIGS. 18A, 18B, 18C, 18D, 19A, 19B, 20A, and 20B are various views of intermediate stages in the manufacturing of FinFETs, in accordance with some embodiments.
Figure 18A:
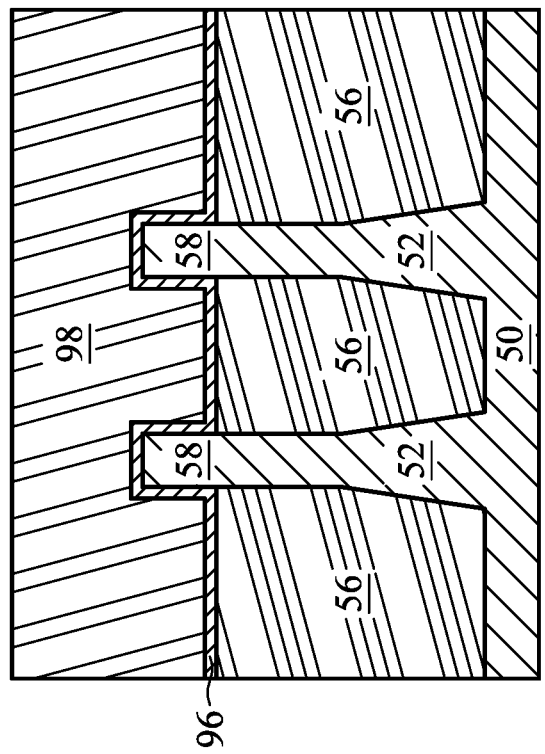
Figure 18C:
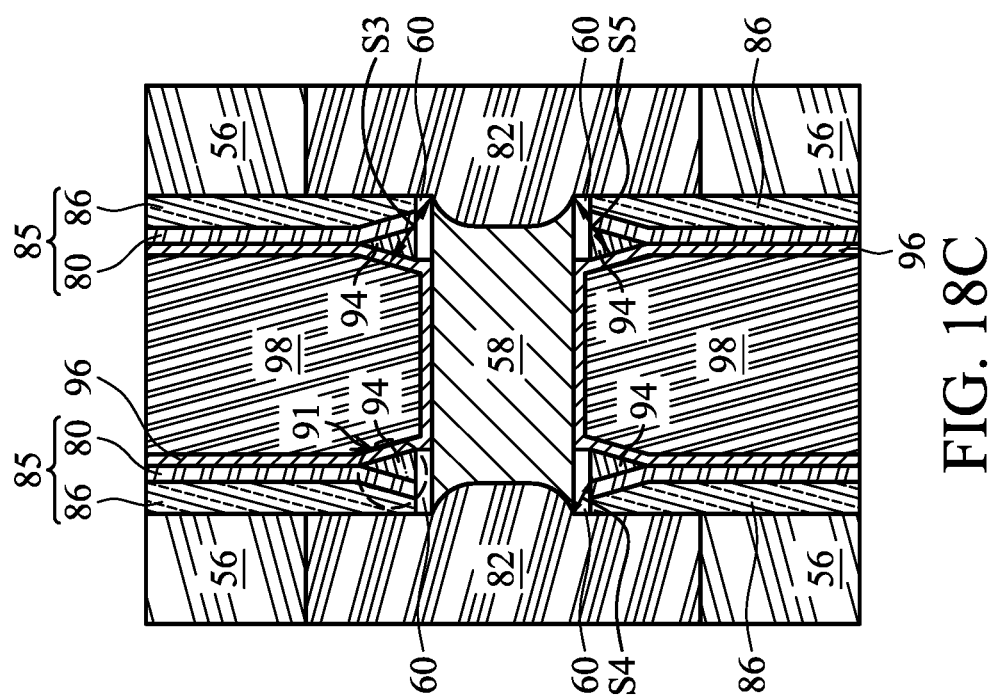
Figure 18D:
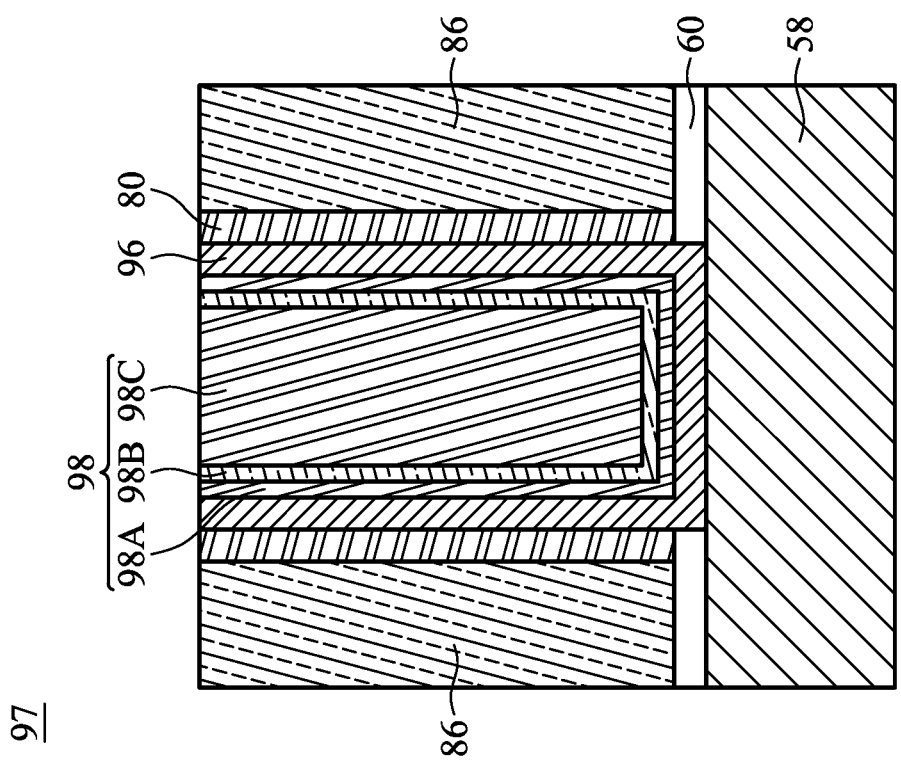

In FIGS. 18A, 18B, 18C, and 18D, gate dielectric layer 96 and gate electrodes 98 are formed for replacement gates within the recesses 90, in accordance with some embodiments. FIG. 18D illustrates a detailed view of region 97 of FIG. 18B. Gate dielectric layer 96 may include one or more layers deposited in the recesses 90, such as on top surfaces and the sidewalls of the fins 52 (e.g., on the channel regions 58) and on sidewalls of the spacers 85. The gate dielectric layers 96 are also deposited on the sidewalls 95 of the corner spacers 94 and on the dummy dielectric layer 60. The gate dielectric layer 96 may also be formed on the top surface of the first ILD 88 (not shown in the figures). In some embodiments, the gate dielectric layer 96 comprise one or more dielectric layers, such as one or more layers of silicon oxide, silicon nitride, metal oxide, metal silicate, or the like. For example, in some embodiments, the gate dielectric layer 96 include an interfacial layer of silicon oxide formed by thermal or chemical oxidation and an overlying high-k dielectric material, such as a metal oxide or a silicate of hafnium, aluminum, zirconium, lanthanum, manganese, barium, titanium, lead, and combinations thereof. The gate dielectric layer 96 may include a dielectric layer having a k value greater than about 7.0. The formation methods of the gate dielectric layer 96 may include Molecular-Beam Deposition (MBD), ALD, PECVD, and the like. In embodiments where portions of the dummy dielectric layer 60 remain in the recesses 90, the gate dielectric layer 96 may include a material of the dummy dielectric layer 60 (e.g., silicon oxide).

The gate electrodes 98 are deposited over the gate dielectric layer 96, respectively, and fill the remaining portions of the recesses 90. The gate electrodes 98 may include a metal-containing material such as titanium nitride, titanium oxide, tantalum nitride, tantalum carbide, cobalt, ruthenium, aluminum, tungsten, combinations thereof, or multi-layers thereof. For example, although a single layer gate electrode 98 is illustrated in FIGS. 18B-C, the gate electrode 98 may comprise any number of liner layers 98A, any number of work function tuning layers 98B, and a fill material 98C as illustrated by FIG. 18D. After the filling of the recesses 90, a planarization process, such as a CMP, may be performed to remove the excess portions of the gate dielectric layer 96 and the material of the gate electrodes 98, which excess portions are over the top surface of the ILD 88. The remaining portions of material of the gate electrodes 98 and the gate dielectric layer 96 thus form replacement gates of the resulting FinFETs. The gate electrodes 98 and the gate dielectric layer 96 may be collectively referred to as a "replacement gate," a "gate structure," or a "gate stack." The gate and the gate stacks may extend along sidewalls of a channel region 58 of the fins 52.

Referring to FIG. 18C, the corner spacers 94 block the gate dielectric layers 96 and the gate electrodes 98 from being deposited in at least a portion of the corner regions 91. Thus, the presence of the corner spacers 94 increases the overall separation distance S3 between the epitaxial source/drain regions 82 and the gate electrode 98 near the corner regions 91. For example, without the formation of the corner spacers 94, the gate dielectric layer 96 would be deposited within the corner regions 91, and the gate dielectric layer 96 would be separated from the epitaxial source/drain regions 82 by a distance S4. In some embodiments, the distance S4 may be between about 10 Å and about 100 Å, though other distances are possible. Due to the corner spacers 94, the gate dielectric layer 96 is separated from the epitaxial source/drain regions 82 by a distance S5 that is larger than the distance S4. In some embodiments, the distance S5 may be between about 10 Å and about 700 Å. In some embodiments, the distance S5 may be between about 0.5 Å and about 600 Å larger than the distance S4. Other distances or relative distances are possible. In this manner, by forming the corner spacers 94, the separation distance S3 between the epitaxial source/drain regions 82 and adjacent gate electrodes 98 may be increased. In some embodiments, the separation distance S3 may be between about 10 Å and about 800 Å. In some embodiments, the use of corner spacers 94 as described herein can increase the separation distance S3 between a gate electrode 98 and an adjacent source/drain region 82 by between about 10 Å and about 700 Å. Other distances or relative distances are possible. It will also be appreciated that the distances S3, S4, and/or S5 shown in FIG. 18C are intended as representative of relative distances between the epitaxial source/drain regions 82 and the associated features. For example, the distances S3, S4, and/or S5 may represent minimum distances, average distances, "effective" distances, approximate distances, or the like.

In some embodiments, the presence of the corner spacers 94 causes the gate stack to be formed having rounded edges or chamfered edges near the corner regions 91. For example, the gate stacks near the fins 52 may be shaped approximately like a rectangle with rounded corners (e.g., a "stadium" shape or oval shape) or approximately like a rectangle with chamfered corners. Other shapes of the gate stack are possible, and depend on the particular shape(s) of the corner spacers 94. By etching the dielectric layer 92 to form corner spacers 94, the separation distance S3 may be increased without significantly decreasing the size of the gate stacks, as might be the case if the dielectric layer 92 remains unetched. The separation distance S3 may also depend on the particular shape(s) of the corner spacers 94, and the shape or size of the corner spacer 94 may be controlled to control the separation distance S3. For example, a corner spacer 94 formed having a convex sidewall 95 (e.g., such as shown in FIG. 17D, or the like) may allow for a larger separation distance S3 than a corner spacer 94 formed having a concave sidewall 95 (e.g., such as shown in FIG. 17B, or the like). Forming a relatively larger corner spacer 94 can allow for a relatively larger separation distance S3, and forming a relatively smaller corner spacer 94 can allow for a relatively smaller separation distance S3. In some cases, the particular shapes or sizes of the corner spacers 94 or the gate stacks and the particular separation distance S3 may be formed as desired for a particular application, device, or structure.

In some cases, by forming corner spacers 94 that increase the separation distance S3 between the gate electrodes 98 and the epitaxial source/drain regions 82, device performance may be improved. For example, increasing the separation distance S3 can reduce parasitic capacitance between the gate electrodes 98 and the epitaxial source/drain regions 82, which can improve device speed. In some cases, increasing the separation distance S3 can reduce current leakage between the gate stack and the epitaxial source/drain regions 82. Additionally, increasing the separation distance S3 can reduce the chance of shorts (e.g. due to conductive residue or the like) being formed between the gate stack and the epitaxial source/drain regions 82 during device manufacture. This can improve yield, process flexibility, and device reliability.

The formation of the gate dielectric layer 96 in the n-type region 50N and the p-type region 50P may occur simultaneously such that the gate dielectric layer 96 in each region are formed from the same materials, and the formation of the gate electrodes 98 may occur simultaneously such that the gate electrodes 98 in each region are formed from the same materials. In some embodiments, the gate dielectric layer 96 in each region may be formed by distinct processes, such that the gate dielectric layer 96 may be different materials, and/or the gate electrodes 98 in each region may be formed by distinct processes, such that the gate electrodes 98 may be different materials. Various masking steps may be used to mask and expose appropriate regions when using distinct processes.

Figure 19B:
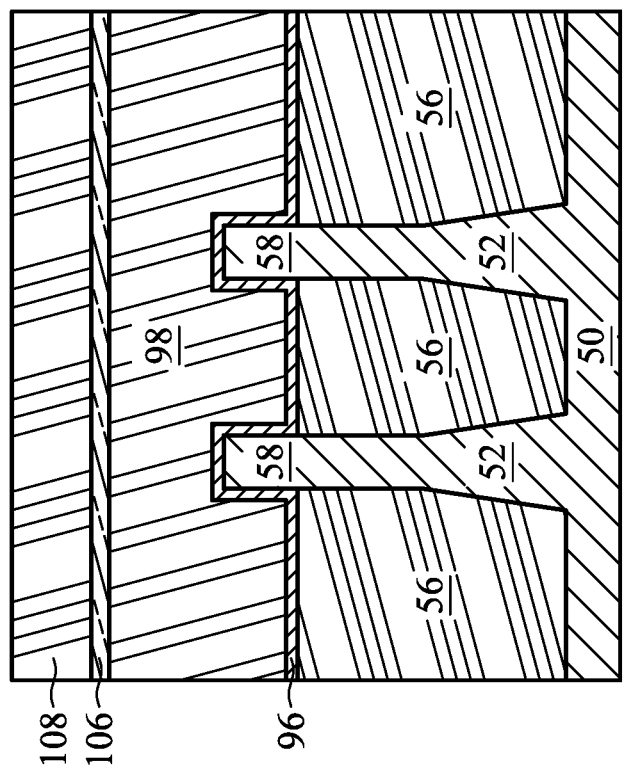
Figure 19A:
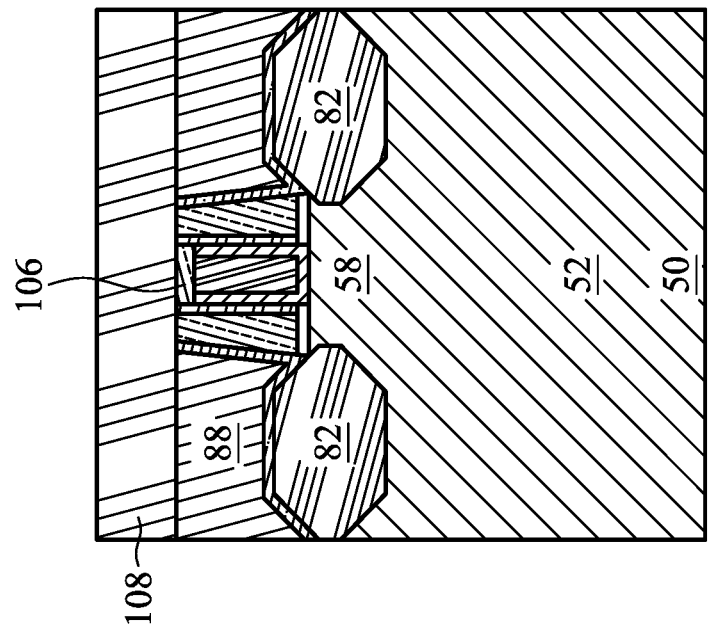

In FIGS. 19A and 19B, a gate mask 106 is formed over the gate stack (including a gate dielectric layer 96 and a corresponding gate electrode 98), and the gate mask may be disposed between opposing portions of the gate spacers 86.

In some embodiments, forming the gate mask 106 includes recessing the gate stack so that a recess is formed directly over the gate stack and between opposing portions of gate spacers 86. A gate mask 106 comprising one or more layers of dielectric material, such as silicon nitride, silicon oxynitride, or the like, is filled in the recess, followed by a planarization process to remove excess portions of the dielectric material extending over the first ILD 88.

As also illustrated in FIGS. 19A and 19B, a second ILD 108 is deposited over the first ILD 88. In some embodiments, the second ILD 108 is a flowable film formed by a flowable CVD method. In some embodiments, the second ILD 108 is formed of a dielectric material such as PSG, BSG, BPSG, USG, or the like, and may be deposited by any suitable method, such as CVD and PECVD. The subsequently formed gate contacts 110 (FIGS. 20A and 20B) penetrate through the second ILD 108 and the gate mask 106 to contact the top surface of the recessed gate electrode 98.

Figure 20B:
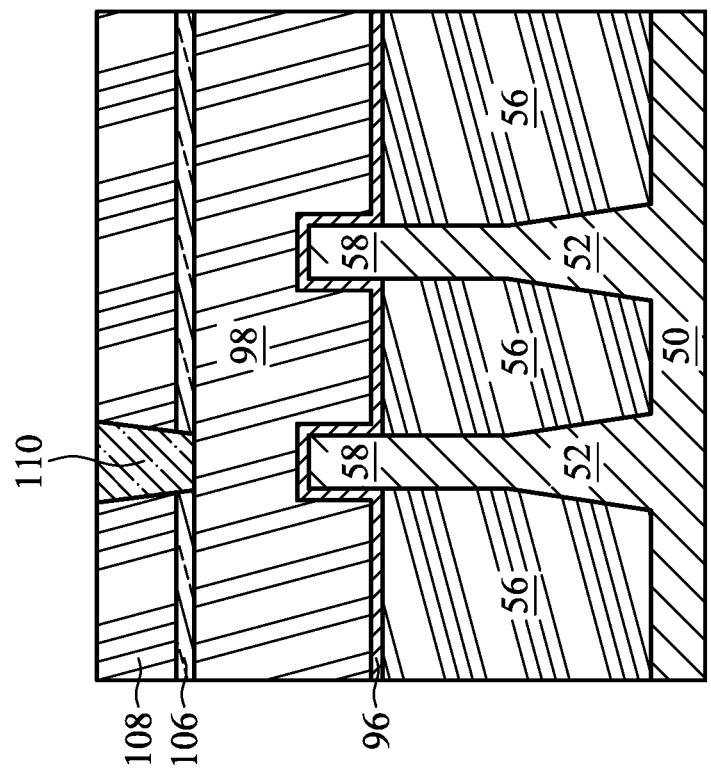
Figure 20A:
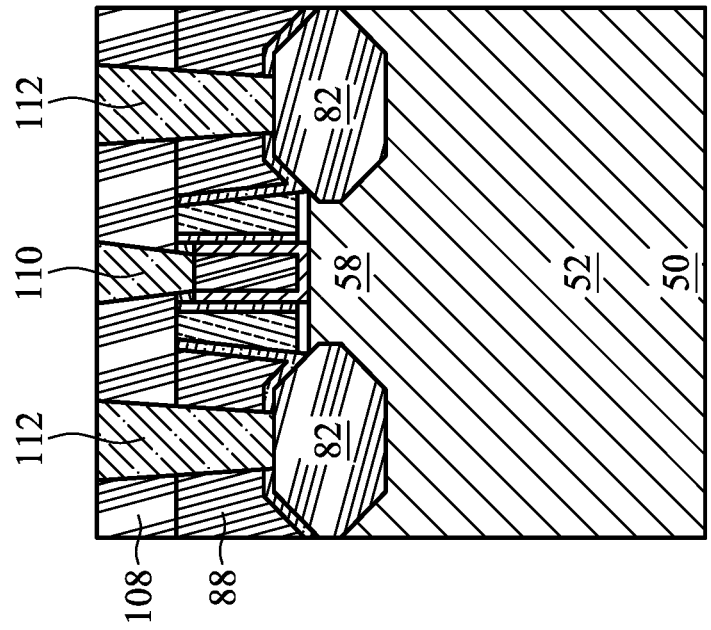

In FIGS. 20A and 20B, gate contacts 110 and source/drain contacts 112 are formed through the second ILD 108 and the first ILD 88 in accordance with some embodiments. Openings for the source/drain contacts 112 are formed through the first and second ILDs 88 and 108, and openings for the gate contact 110 are formed through the second ILD 108 and the gate mask 106. The openings may be formed using acceptable photolithography and etching techniques. A liner (not shown), such as a diffusion barrier layer, an adhesion layer, or the like, and a conductive material are formed in the openings. The liner may include titanium, titanium nitride, tantalum, tantalum nitride, or the like. The conductive material may be copper, a copper alloy, silver, gold, tungsten, cobalt, aluminum, nickel, or the like. A planarization process, such as a CMP, may be performed to remove excess material from a surface of the ILD 108. The remaining liner and conductive material form the source/drain contacts 112 and gate contacts 110 in the openings. An anneal process may be performed to form a silicide at the interface between the epitaxial source/drain regions 82 and the source/drain contacts 112. The source/drain contacts 112 are physically and electrically coupled to the epitaxial source/drain regions 82, and the gate contacts 110 are physically and electrically coupled to the gate electrodes 98. The source/drain contacts 112 and gate contacts 110 may be formed in different processes, or may be formed in the same process. Although shown as being formed in the same cross-sections, it should be appreciated that each of the source/drain contacts 112 and gate contacts 110 may be formed in different cross-sections, which may avoid shorting of the contacts.

Figure 21A:
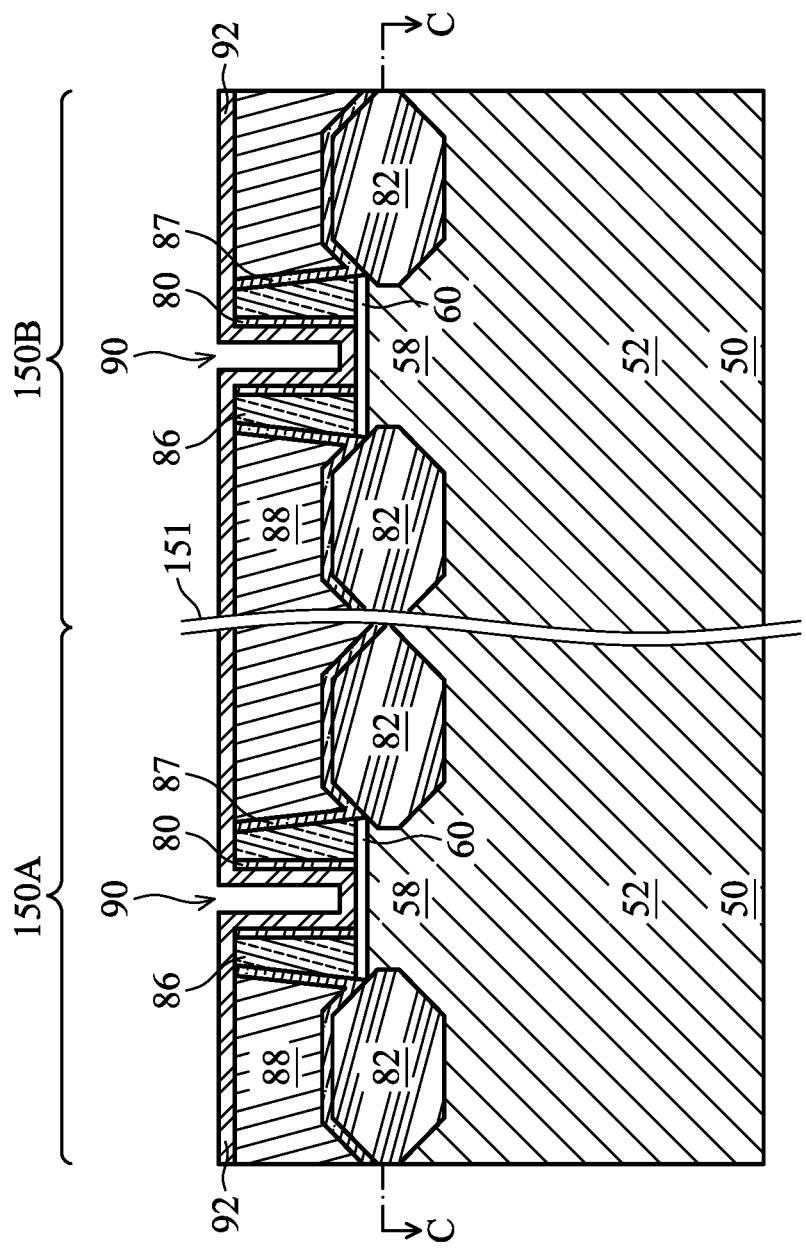
FIGS. 21A, 21B, 21C, 22A, 22B, 22C, 23A, 23B, 23C, 24A, 24B, and 24C are various views of intermediate stages in the manufacturing of FinFETs having corner spacers, in accordance with some embodiments.
Figure 21B:
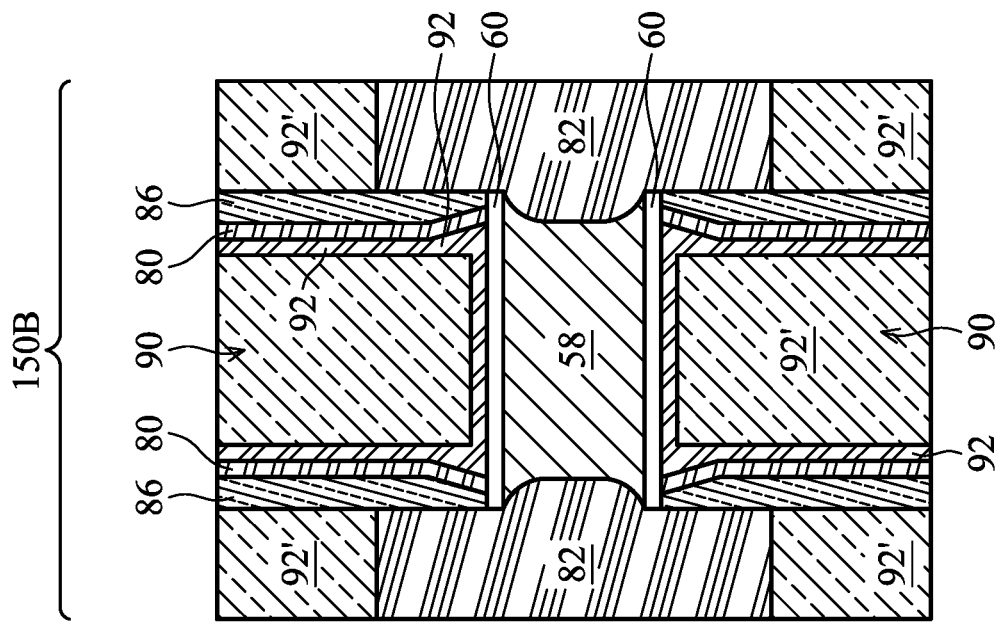
Figure 21C:
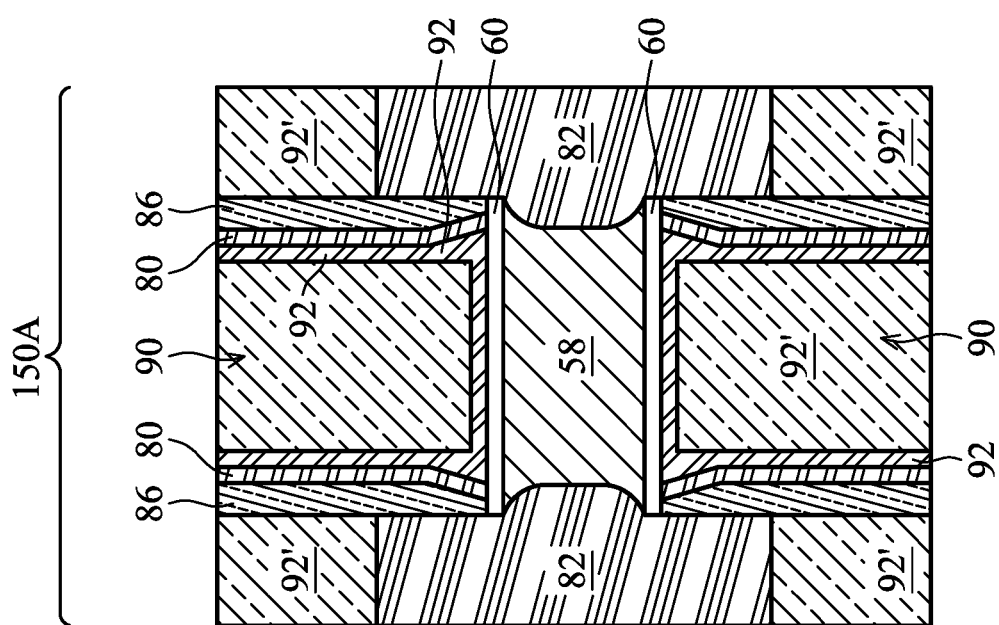

FIGS. 21A-C through FIGS. 24A-C illustrate intermediate steps in the formation of corner spacers 94 in a first region 150A of a substrate 50 and not in a second region 150B of the substrate 50, in accordance with some embodiments. FIGS. 21A-C illustrate a structure similar to that shown in FIGS. 14A-C (e.g., after a dielectric layer 92 has been deposited), except that the substrate 50 has a first region 150A for forming first types of devices (e.g., a core logic region) and a second region 150B for forming second types of devices (e.g., an input/output region). The first region 150A may be physically separated from the second region 150B (as illustrated by divider 151), and any number of device features (e.g., other active devices, doped regions, isolation structures, etc.) may be disposed between the first region 150A and the second region 150B. The first region 150A and/or the second region 150B may overlap or may be separate from the n-type region 50N and/or the p-type region 50P. FIGS. 21A, 22A, 23A, and 24A illustrate cross-sectional views of the first region 150A and the second region 150B along the reference cross-section A-A. FIGS. 21B, 22B, 23B, and 24B illustrate plan views of the first region 150A at the cross-section C-C, and FIGS. 21C, 22C, 23C, and 24C illustrate plan views of the second region 150B at the cross-section C-C. In other embodiments, a substrate 50 may have more than two regions.

FIGS. 21A-C illustrate the first region 150A and the second region 150B after the dielectric layer 92 has been deposited, similar to FIGS. 14A-C. FIGS. 21A-C show the devices of the first region 150A and the second region 150B as having similar features, but in other embodiments different regions may have different devices or devices with differing features, and all such variations are considered within the scope of the present disclosure.

Figure 22A:
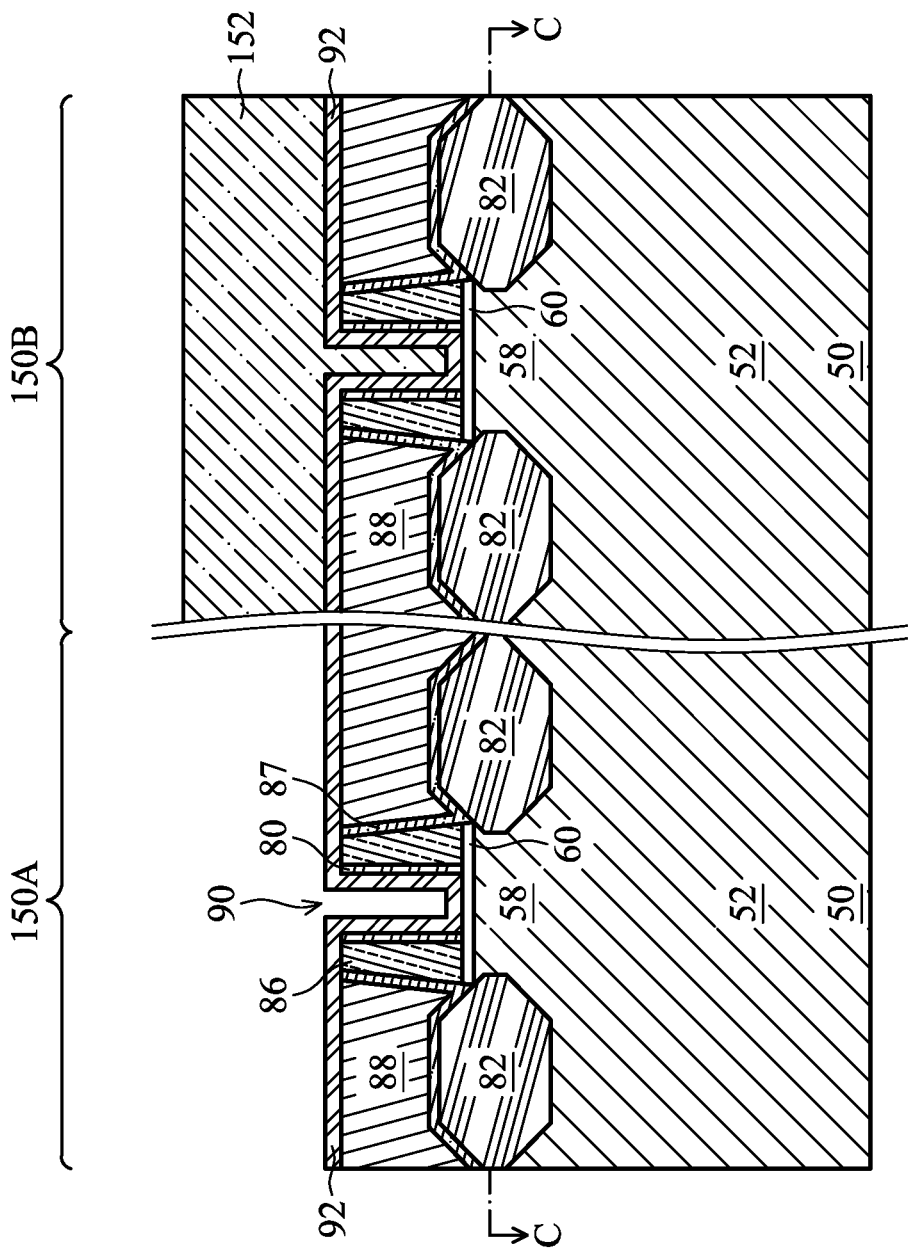
Figure 22C:
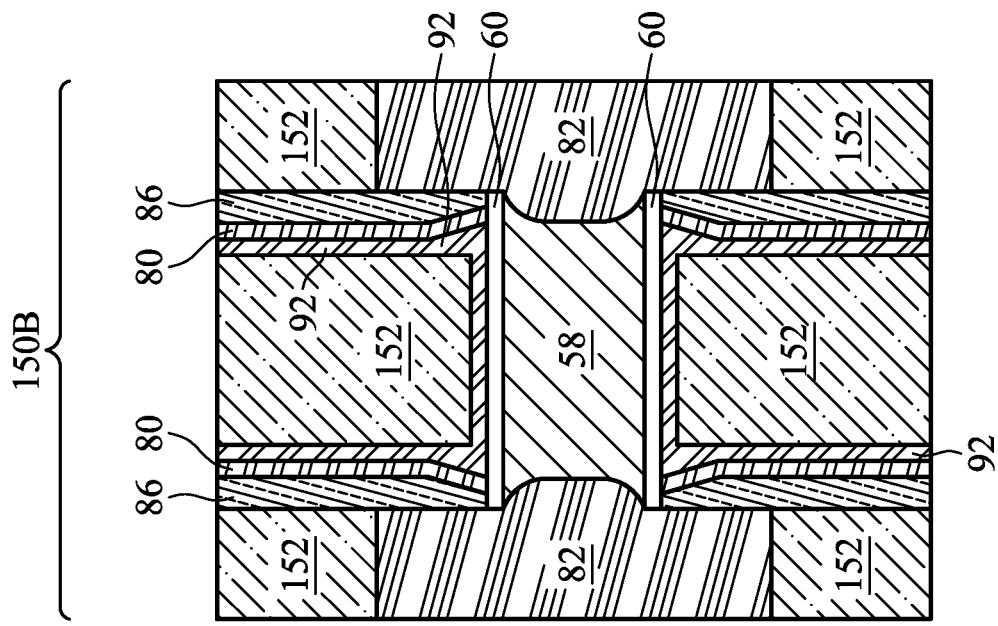
Figure 22B:
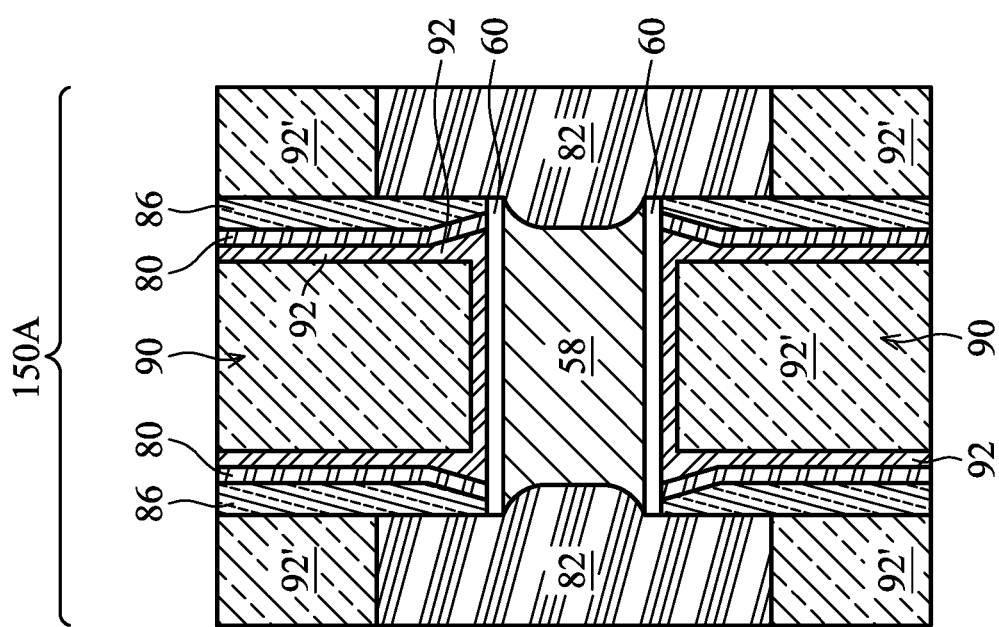

In FIGS. 22A-C, a masking layer 152 is formed and patterned, in accordance with some embodiments. The masking layer 152 may be formed over the dielectric layer 92 in the first region 150A and the second region 150B. The masking layer 152 may be, for example, a photoresist, a photoresist structure, or the like, and may be formed using a spin-on process or another suitable technique. The masking layer 152 may then be patterned to expose the first region 150A. The masking layer 152 may be patterned using acceptable photolithography techniques. As shown in FIGS. 22A-C, the patterned masking layer 152 covers the dielectric layer 92 in the second region 150B, including within the recesses 90 of the second region 150B.

Figure 23A:
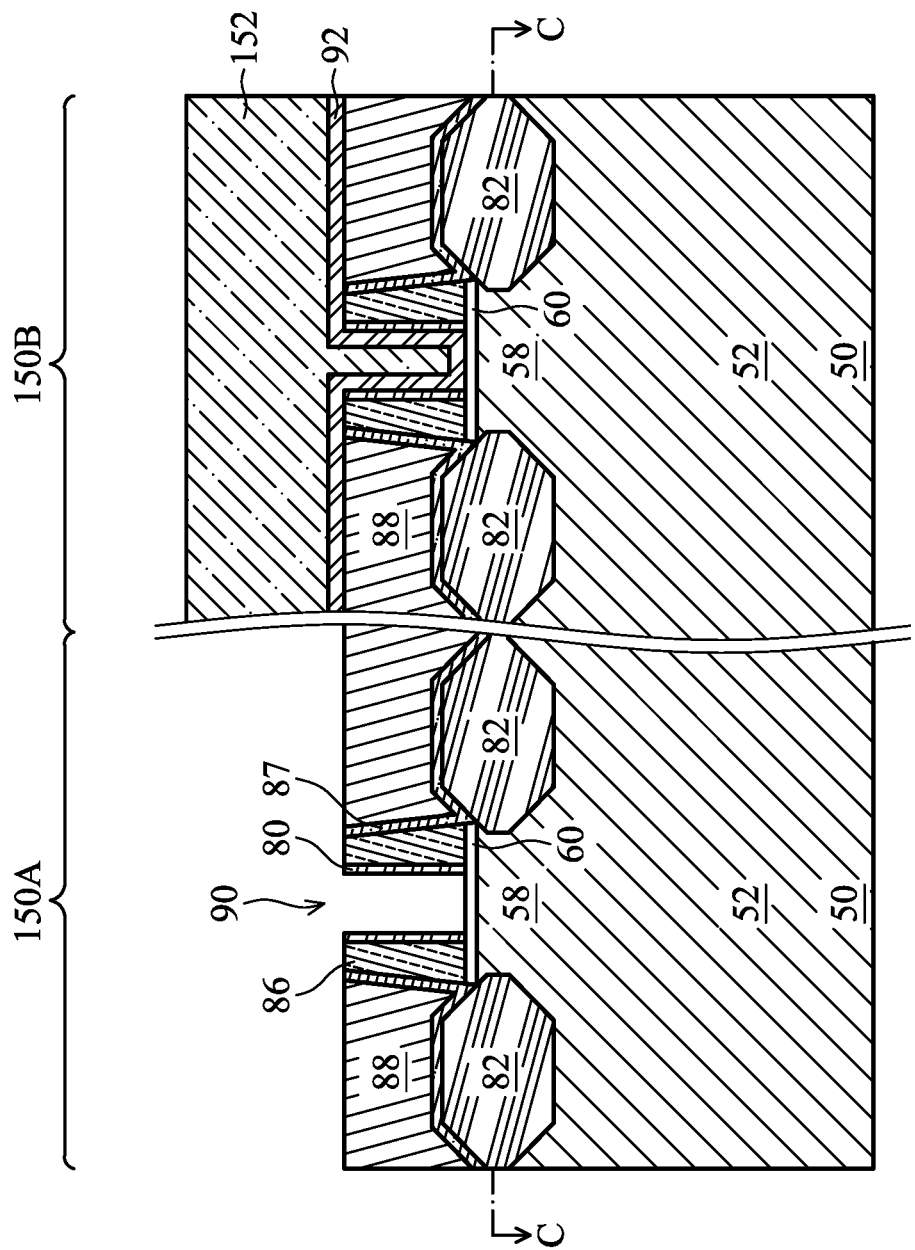
Figure 23C:
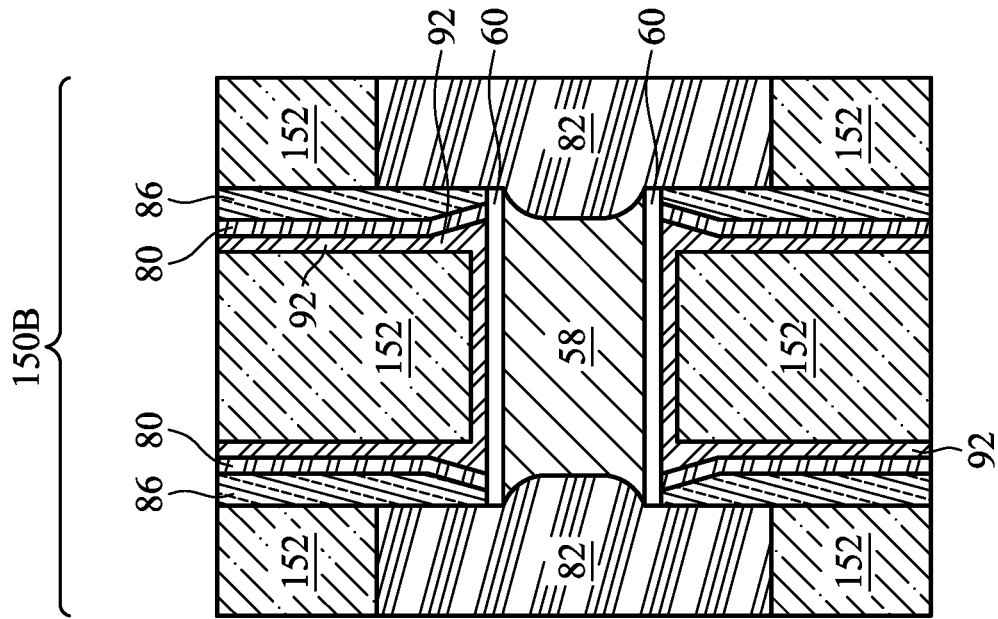
Figure 23B:
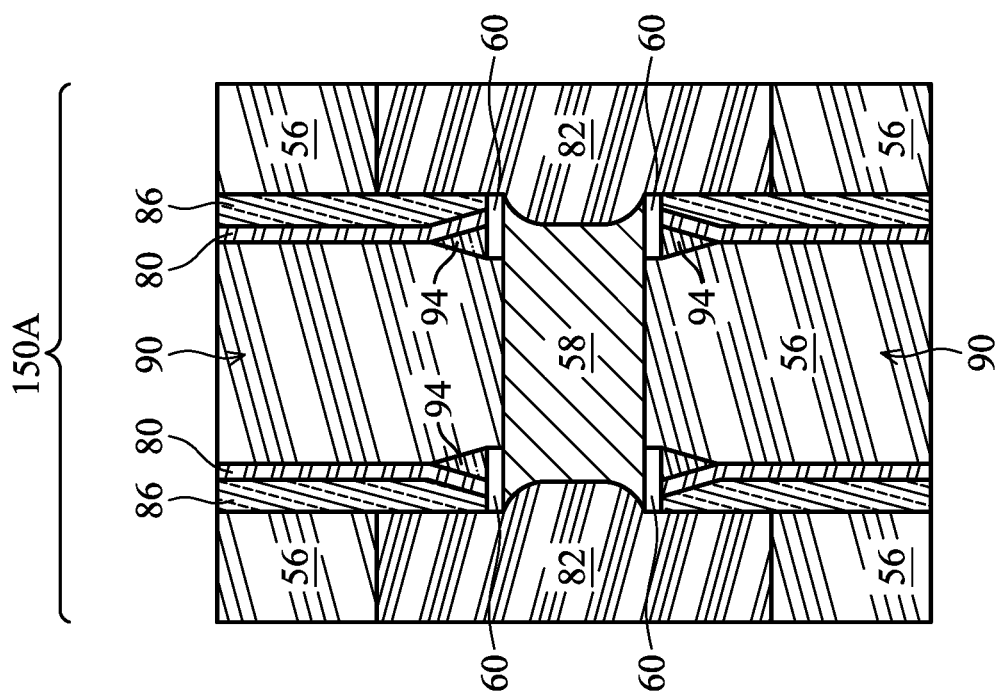

In FIGS. 23A-C, an etching process is performed to etch the dielectric layer 92 in the first region 150A, in accordance with some embodiments. The etching process may be similar to that described for FIGS. 16A-C, and accordingly forms corner spacers 94 in the recesses 90 of the first region 150A. FIGS. 23A and 23B show the dummy dielectric layer 60 of the first region 150A as being etched by the etching process, but in other embodiments the dummy dielectric layer 60 may be left remaining on the channel regions 58. As shown in FIGS. 23A and 23C, the masking layer 152 covering the second region 150B blocks the dielectric layer 92 of the second region 150B from being etched by the etching process.

Figure 24A:
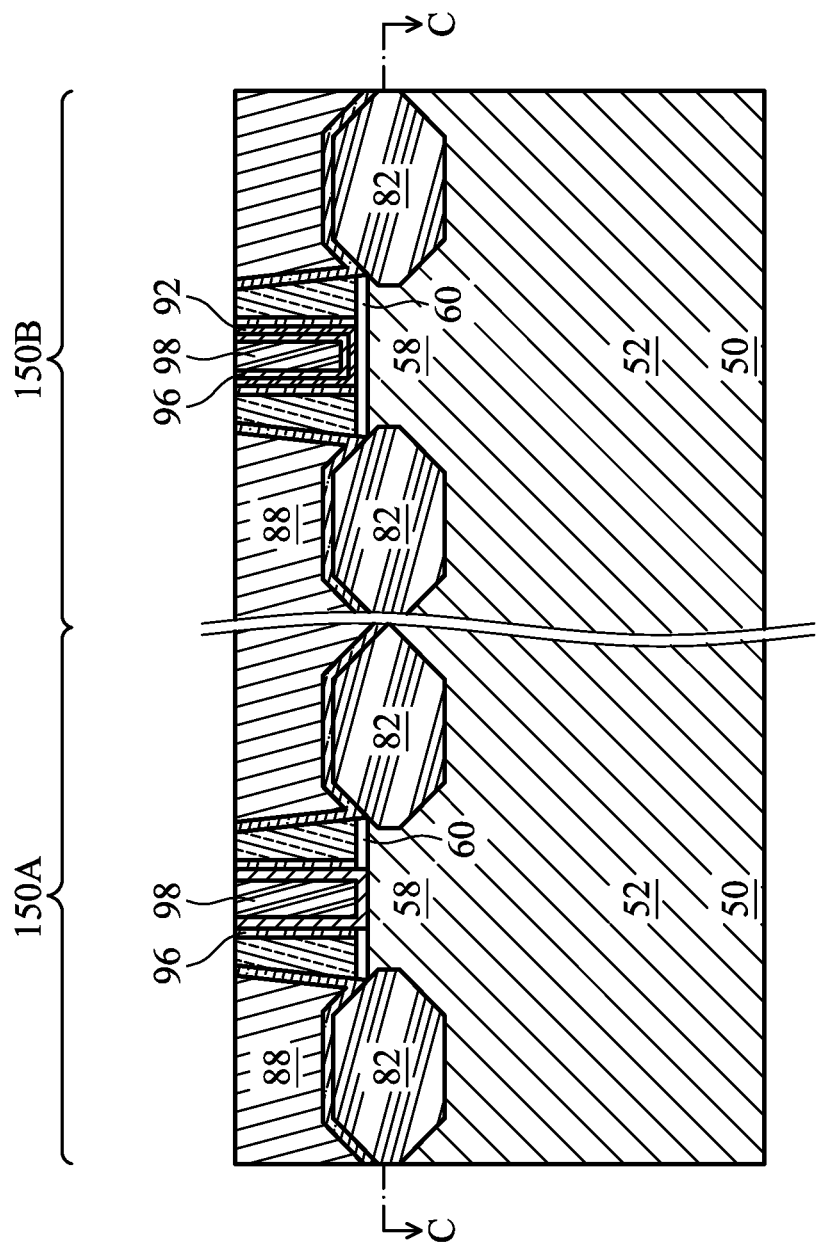
Figure 24C:
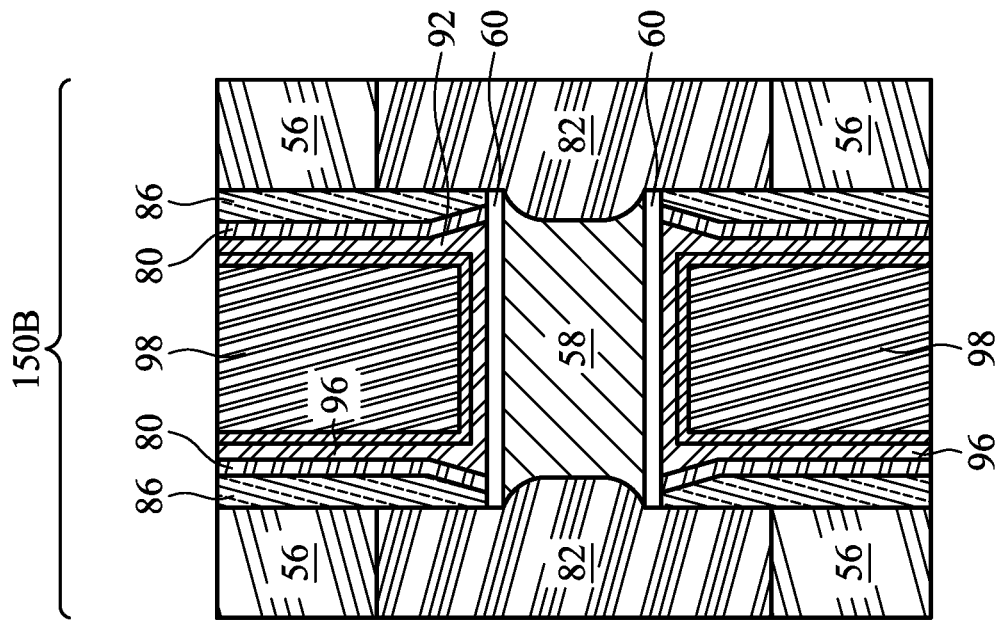
Figure 24B:
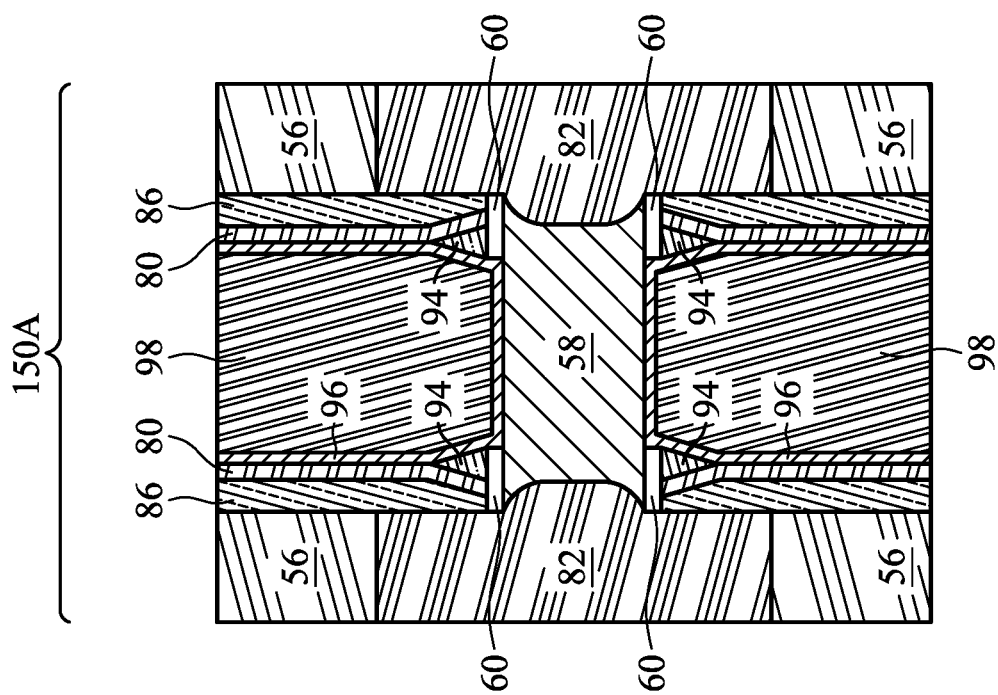

In FIGS. 24A-C, the masking layer 152 is removed and gate stacks are formed in the first region 150A and in the second region 150B, in accordance with some embodiments. The masking layer 152 may be removed using a suitable process, such as an etching process or ashing process. The gate stacks may include a gate dielectric layer 96 and a gate electrode 98, similar to the gate stacks described for FIGS. 18A-C, which may be formed using suitable techniques such as those described previously. In some embodiments, the gate stacks in the first region 150A may be formed simultaneously with the gate stacks in the second region 150B. In other embodiments, the gate dielectric layer 96 and/or a gate electrode 98 in the first region 150A may be formed before the masking layer 152 is removed, and the gate dielectric layer 96 and/or the gate electrode 98 in the second region 150B formed after the masking layer 152 is removed.

As shown in FIGS. 24A-C, the gate stacks may be formed on the dielectric layer 92 in the second region 150B. In this manner, the gate dielectric layers for the devices in the second region 150B may include the dielectric layer 92 and the dummy dielectric layer 60, resulting in the device having an effectively thicker gate dielectric layer. Additionally, the presence of the dielectric layer 92 within the recesses 90 can provide additional separation between the gate electrodes 98 and the epitaxial source/drain regions 82 to reduce leakage or capacitance. In some cases, a thicker gate dielectric layer may be used for relatively higher-power or higher-voltage devices such as input/output devices or the like. In this manner, the corner spacers 94 and thicker gate dielectric layers may be formed for devices in separate regions, but using some of the same processing steps. The embodiment described for FIGS. 21A-24C is an example, and other variations are possible, including additional masking steps, additional deposition steps, additional etching steps, or the like.

The disclosed FinFET embodiments could also be applied to nanostructure devices such as nanostructure (e.g., nanosheet, nanowire, gate-all-around, or the like) field effect transistors (NSFETs). In an NSFET embodiment, the fins are replaced by nanostructures formed by patterning a stack of alternating layers of channel layers and sacrificial layers. Dummy gate stacks and source/drain regions are formed in a manner similar to the above-described embodiments. After the dummy gate stacks are removed, the sacrificial layers can be partially or fully removed in channel regions. In some embodiments, a dielectric layer similar to the dielectric layer 92 described herein may be formed and etched, with regions of the dielectric layer being incompletely etched to leave remaining portions similar to the corner spacers 94 described herein. The replacement gate structures are formed in a manner similar to the above-described embodiments, the replacement gate structures may partially or completely fill openings left by removing the sacrificial layers, and the replacement gate structures may partially or completely surround the channel layers in the channel regions of the NSFET devices. ILDs and contacts to the replacement gate structures and the source/drain regions may be formed in a manner similar to the above-described embodiments. A nanostructure device can be formed as disclosed in U.S. Patent Application Publication No. 2016/0365414, which is incorporated herein by reference in its entirety.

The embodiments described here have some advantages. The techniques described herein allow for the formation of corner spacers adjacent the gate spacers and the channel region of a fin. The corner spacers may be formed by depositing a dielectric layer after dummy gate removal, and then controlling an etching of the dielectric layer such that portions of the dielectric layer remain as the corner spacers. The corner spacers are left in place during formation of the replacement gate stack, which results in portions of the replacement gate stack being separated from the epitaxial source/drain regions by the corner spacers. This additional separation provided by the corner spacers can reduce parasitic capacitance between the gate stack and the epitaxial source/drain regions, which can improve high-speed performance of the device. Additionally, the use of the corner spacers can reduce current leakage between the gate stack and the epitaxial source/drain regions. The size or shape of the corner regions can be controlled for a particular application. Additionally, the use of corner spacers can separate the gate stack from the epitaxial source/drain regions without significantly reducing the size of the gate stack. In some cases, masking steps can be used to form corner spacers in separate regions of a substrate. In some cases, the corner spacers as described herein can be formed without decreasing the process window for gate stack formation or increasing drain-induced barrier leakage (DIBL) effects. As such, in some cases the corner spacers can achieve the advantages described herein without significant process changes, device layout changes, or impact to other areas of device performance.

In accordance with an embodiment, a device includes a fin protruding from a semiconductor substrate; a gate stack over and along a sidewall of the fin; a gate spacer along a sidewall of the gate stack and along the sidewall of the fin; an epitaxial source/drain region in the fin and adjacent the gate spacer; and a corner spacer between the gate stack and the gate spacer, wherein the corner spacer extends along the sidewall of the fin, wherein a first region between the gate stack and the sidewall of the fin is free of the corner spacer, wherein a second region between the gate stack and the gate spacer is free of the corner spacer. In an embodiment, the device includes a dummy gate dielectric layer extending along the sidewall of the fin, wherein the dummy gate dielectric layer is between the corner spacer and the fin. In an embodiment, the gate stack includes a gate dielectric layer that physically contacts the corner spacer. In an embodiment, the corner spacer includes silicon oxide, silicon carbide, silicon oxycarbide, silicon oxynitride, silicon oxynitride, or silicon oxycarbonitride. In an embodiment, the corner spacer extends along the sidewall of the fin a distance that is in the range of 0.5 Å to 600 Å. In an embodiment, the corner spacer has a triangular cross-section in a plan view. In an embodiment, the surface of the corner spacer that extends along the sidewall of the gate stack has a concave profile. In an embodiment, the gate stack includes a gate dielectric and a gate electrode, wherein the gate dielectric physically contacts the fin.

In accordance with an embodiment, a device includes a fin over a substrate; a gate structure on an upper surface and opposing sidewalls of the fin; gate spacers along the opposing sidewalls of the gate structure, wherein first portions of the gate spacers have a first width, wherein second portions of the gate spacers have a second width that is greater than the first width, wherein the first portions are closer to the fin than the second portions, wherein the first width and the second width are measured in a first direction parallel to a sidewall of the fin; a dummy dielectric material on the fin, wherein the dummy dielectric material extends between the fin and the gate spacers; and corner spacers, wherein each of the corner spacers is interposed between the gate structure and a corresponding one of the first portions of the gate spacers. In an embodiment, the second portions of the gate spacers physically contact the gate structure. In an embodiment, a first portion of the gate structure has a third width, wherein a second portion of the gate structure has a fourth width that is greater than the third width, wherein the first portion of the gate structure is closer to the fin than the second portion of the gate structure, and wherein the third width and the fourth width are measured in the first direction. In an embodiment, the first portions of the gate spacers are separated by a first distance in the first direction, wherein the first distance is greater than the fourth width. In an embodiment, the corner spacers have convex sidewalls facing the gate structure. In an embodiment, the corner spacer has length measured in a second direction that is in the range of 0.5 Å to 600 Å, the second direction being orthogonal to the sidewall of the fin. In an embodiment, a portion of the corner spacer that has the largest width in the first direction physically contacts the dummy dielectric material. In an embodiment, a material of the corner spacer is different from the dummy dielectric material.

In an accordance with an embodiment, a method of forming a semiconductor device includes forming a fin protruding from a substrate; forming a dummy gate structure extending over a channel region of the fin; forming a first spacer layer on sidewalls of the dummy gate structure; epitaxially growing source/drain regions on the fin adjacent the channel region; removing the dummy gate structure to form a recess; depositing a second spacer layer within the recess; performing an etching process on the second spacer layer, wherein after performing the etching process, remaining portions of the second spacer layer remain within the recess to form corner spacers, wherein the corner spacers are separated from each other, wherein the corner spacers are located at corner regions of the recess adjacent the fin; and forming a replacement gate structure within the recess and on the corner spacers. In an embodiment, the etching process exposes the channel region. In an embodiment, forming the replacement gate structure includes depositing a gate dielectric material on the corner spacers and on the channel region in the recess, wherein the gate dielectric material physically contacts the channel region and the first spacer layer; and depositing a gate electrode material on the gate dielectric material. In an embodiment, the remaining portions of the second spacer layer each have a length in a range of 0.5 Å to 600 Å.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
forming a fin protruding from a substrate;
forming a dummy gate structure extending over a channel region of the fin;
forming a first spacer layer on sidewalls of the dummy gate structure;
epitaxially growing source/drain regions on the fin adjacent the channel region;
removing the dummy gate structure to form a recess;
depositing a second spacer layer within the recess;
performing an etching process on the second spacer layer, wherein the etching process selectively etches the second spacer layer more than the first spacer layer, wherein after performing the etching process, remaining portions of the second spacer layer remain within the recess to form corner spacers, wherein the corner spacers are separated from each other, wherein the corner spacers are located at corner regions of the recess adjacent the fin; and
forming a replacement gate structure within the recess and on the corner spacers.

2. The method of claim 1, wherein the etching process exposes the channel region.

3. The method of claim 1, wherein forming the replacement gate structure comprises:
depositing a gate dielectric material on the corner spacers and on the channel region in the recess, wherein the gate dielectric material physically contacts the channel region and the first spacer layer; and
depositing a gate electrode material on the gate dielectric material.

4. The method of claim 1, wherein the remaining portions of the second spacer layer each have a length in the range of 0.5 Å to 600 Å.

5. The method of claim 1, wherein the second spacer layer is deposited to a thickness in the range of 0.5 Å to 300 Å.

6. The method of claim 1, wherein the etching process comprises an Atomic Layer Etching (ALE) process.

7. The method of claim 1, wherein a distance between the corner spacers is greater than a width of the replacement gate structure.

8. A method comprising:
forming a fin on a semiconductor substrate;
depositing a first dielectric layer on a top surface and a sidewall of the fin;
forming epitaxial source/drain regions in the fin adjacent the first dielectric layer;
depositing a second dielectric layer on a top surface and a sidewall of the first dielectric layer;
depositing a third dielectric layer on a sidewall of the second dielectric layer and on a sidewall of the first dielectric layer;
etching the second dielectric layer to expose first surfaces of the first dielectric layer and the third dielectric layer;
depositing a fourth dielectric layer on the exposed first surfaces of the first dielectric layer and the third dielectric layer;
etching the fourth dielectric layer to expose second surfaces of the first dielectric layer and the third dielectric layer, wherein portions of the fourth dielectric layer remain on the first surfaces of the first dielectric layer and the third dielectric layer; and
forming a gate structure on a surface of the fourth dielectric layer and on the second surfaces of the first dielectric layer and the third dielectric layer.

9. The method of claim 8, further comprising etching the first dielectric layer to expose the sidewall of the fin.

10. The method of claim 8, further comprising depositing a fifth dielectric layer on a sidewall of the third dielectric layer.

11. The method of claim 8, wherein the surface of the fourth dielectric layer forms a line segment extending from the first dielectric layer to the third dielectric layer.

12. The method of claim 8, wherein the surface of the fourth dielectric layer is concave.

13. The method of claim 8, wherein the fourth dielectric layer comprises silicon oxycarbide.

14. The method of claim 8, wherein a width of the second dielectric layer tapers away from the first dielectric layer.

15. A method comprising:
forming a fin extending on a substrate in a first direction;
forming a dummy dielectric layer over the fin;
forming a gate spacer on the dummy dielectric layer and extending over the fin in a second direction perpendicular to the first direction;
forming a corner spacer on the dummy dielectric layer at a corner formed by a sidewall of the dummy dielectric layer and a sidewall of the gate spacer; and
forming a gate structure over the fin and along a sidewall of the fin, the sidewall of the gate spacer, and a sidewall of the corner spacer.

16. The method of claim 15, wherein the corner spacer is between the gate spacer and the gate structure.

17. The method of claim 15, wherein forming the corner spacer comprises depositing a dielectric material over the gate spacer and the fin, and then recessing the dielectric material.

18. The method of claim 15, further comprising, before forming the corner spacer, forming a dummy gate structure over the fin and along the sidewall of the fin.

19. The method of claim 15, wherein the dummy dielectric layer is sandwiched between the corner spacer and the fin.

20. The method of claim 15, wherein the corner spacer extends in a third direction perpendicular to the first direction and the second direction.

\* \* \* \* \*